(12) United States Patent
Ootsuka et al.

(10) Patent No.: US 10,714,806 B2
(45) Date of Patent: Jul. 14, 2020

(54) BI-DIRECTIONAL COUPLER

(71) Applicant: TDK CORPORATION, Tokyo (JP)

(72) Inventors: Noriaki Ootsuka, Tokyo (JP); Keisuke Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 58 days.

(21) Appl. No.: 16/174,862

(22) Filed: Oct. 30, 2018

(65) Prior Publication Data

US 2019/0140336 A1 May 9, 2019

(30) Foreign Application Priority Data

Nov. 6, 2017 (JP) .................... 2017-213465

(51) Int. Cl.
| | |
|---|---|
| *H01P 5/18* | (2006.01) |
| *H01P 1/24* | (2006.01) |
| *H03H 7/38* | (2006.01) |

(52) U.S. Cl.
CPC ............. *H01P 5/18* (2013.01); *H01P 1/24* (2013.01); *H01P 5/187* (2013.01); *H03H 7/38* (2013.01)

(58) Field of Classification Search
CPC .... H01P 5/18; H01P 5/184; H01P 1/18; H01P 1/184; H01P 1/24; H03H 7/38
USPC .......................................... 333/109–112, 116
See application file for complete search history.

(56) References Cited

U.S. PATENT DOCUMENTS

| | | | | |
|---|---|---|---|---|
| 7,042,309 | B2* | 5/2006 | Podell .................... | H01P 5/187 333/112 |
| 7,339,366 | B2* | 3/2008 | Li ......................... | G01R 21/01 324/95 |
| 8,942,658 | B2* | 1/2015 | Banwell .................. | H04B 1/58 343/852 |
| 9,035,718 | B2* | 5/2015 | Tamaru ................... | H01P 5/18 333/109 |
| 2017/0033428 | A1 | 2/2017 | Ootsuka et al. | |
| 2018/0048046 | A1* | 2/2018 | Noguchi .................. | H01P 1/24 |
| 2018/0062235 | A1* | 3/2018 | Lyu ....................... | H01P 5/187 |
| 2018/0331411 | A1* | 11/2018 | Frederick ............... | H01P 5/184 |

* cited by examiner

*Primary Examiner* — Dean O Takaoka
(74) *Attorney, Agent, or Firm* — Oliff PLC

(57) ABSTRACT

A bi-directional coupler includes a first individual directional coupler and a second individual directional coupler, which are individual electronic components having mutually equivalent circuit configurations. Each of the first and second individual directional couplers includes: a first terminal; a second terminal; a third terminal; a fourth terminal; a main line connecting the first terminal and the second terminal; and a subline connecting the third terminal and the fourth terminal. The subline includes first and second coupling line sections configured to be electromagnetically coupled to the main line, and a matching section provided between the first and second coupling line sections. The second terminal of the second individual directional coupler is electrically connected to the second terminal of the first individual directional coupler.

12 Claims, 13 Drawing Sheets

BI-DIRECTIONAL COUPLER

BACKGROUND OF THE INVENTION

1. Field of the Invention

The present invention relates to a bi-directional coupler.

2. Description of the Related Art

Directional couplers are used for detecting the levels of transmission/reception signals in transmission/reception circuits of wireless communication apparatuses such as cellular phones and wireless LAN communication apparatuses.

A directional coupler configured as follows is known as a conventional directional coupler. The directional coupler has an input port, an output port, a coupling port, a termination port, a main line connecting the input port and the output port, and a subline connecting the coupling port and the termination port. The subline includes a coupling line section configured to be electromagnetically coupled to the main line. The termination port is grounded via a termination resistor having a resistance of 50Ω, for example. The input port receives a high frequency signal, and the output port outputs the same. The coupling port outputs a coupling signal having a power that depends on the power of the high frequency signal received at the input port.

Major parameters indicating the characteristics of directional couplers include coupling and isolation. Definitions of these parameters will now be described. First, assuming that a high frequency signal of power P1 is received at the input port, let P3 represent the power of a signal output from the coupling port. Then, assuming that a high frequency signal of power P02 is received at the output port, let P03 represent the power of a signal output from the coupling port. Further, let C and I represent coupling and isolation, respectively. These parameters are defined by the equations below. Note that where coupling is expressed as −c (dB), the phrase "higher coupling" as used herein means a lower value of c.

$$C=10 \log(P3/P1) \text{ [dB]}$$

$$I=10 \log(P03/P02) \text{ [dB]}$$

Directional couplers for use in wireless communication devices are sometimes required to be bi-directional. The term "bi-directional" means that the characteristics of the directional couplers remain the same even if used with the input port and the output port reversed and with the coupling port and the termination port reversed. Examples of situations where a directional coupler is required to be bi-directional include when the directional coupler is provided in a transmission circuit for supplying a transmission signal to an antenna and is intended to detect the level of the transmission signal and also the level of a reflected-wave signal that occurs by reflection of the transmission signal off the antenna. The purpose for detecting the level of the reflected-wave signal by the directional coupler is to adjust the characteristics of an impedance matching element provided between the transmission circuit and the antenna so as to sufficiently reduce the level of the reflected-wave signal. In this example, when the directional coupler detects the level of a transmission signal, the transmission signal is received at the input port and output from the output port, and a signal having power corresponding to the level of the transmission signal is output from the coupling port. On the other hand, when the directional coupler detects the level of a reflected-wave signal, the reflected-wave signal is received at the output port and output from the input port, and a signal having power corresponding to the level of the reflected-wave signal is output from the termination port.

US 2017/0033428 A1 discloses a bi-directional coupler. The bi-directional coupler disclosed in US 2017/0033428 A1 includes a first port, a second port, a third port, a fourth port, a main line connecting the first port and the second port, and a subline connecting the third port and the fourth port. The subline includes a first, a second and a third subline section each of which is formed of a line configured to be electromagnetically coupled to the main line, and a first and a second matching section. The first matching section is provided between the first subline section and the second subline section. The second matching section is provided between the second subline section and the third subline section.

Conventionally, the realization of a bi-directional coupler requires spending much effort on the design of circuitry.

SUMMARY OF THE INVENTION

It is an object of the present invention to provide a bi-directional coupler that easily achieves the bi-directionality.

A bi-directional coupler of the present invention includes a first individual directional coupler and a second individual directional coupler, the first and second individual directional couplers being individual electronic components having mutually equivalent circuit configurations. Each of the first and second individual directional couplers includes a first terminal, a second terminal, a third terminal, a fourth terminal, a main line connecting the first terminal and the second terminal, and a subline connecting the third terminal and the fourth terminal. The subline includes at least one coupling line section configured to be electromagnetically coupled to the main line.

Each of the first and second individual directional couplers functions as a directional coupler by using the first terminal as an input port, the second terminal as an output port, the third terminal as a coupling port, and the fourth terminal as a termination port.

The second terminal of the second individual directional coupler is electrically connected to the second terminal of the first individual directional coupler. The bi-directional coupler functions as a directional coupler in both of a first mode and a second mode. The first mode is a mode in which the first terminal of the first individual directional coupler is used as the input port, the first terminal of the second individual directional coupler is used as the output port, and the third terminal of the first individual directional coupler is used as the coupling port. The second mode is a mode in which the first terminal of the second individual directional coupler is used as the input port, the first terminal of the first individual directional coupler is used as the output port, and the third terminal of the second individual directional coupler is used as the coupling port.

In the bi-directional coupler of the present invention, the subline may include a first coupling line section and a second coupling line section as the at least one coupling line section. In such a case, the subline may further include a matching section that is provided between the first coupling line section and the second coupling line section in circuit configuration. As used herein, the phrase "in circuit configuration" is to describe layout in a circuit diagram, not in a physical configuration. The matching section causes a change in the phase of a signal passing therethrough. The first coupling line section and the second coupling line section may have mutually different strengths of coupling to the main line.

In the bi-directional coupler of the present invention, the first and second individual directional couplers may be arranged in a first plane. In this case, the first to fourth terminals of the second individual directional coupler may have plane-symmetrical positional relationship with the first to fourth terminals of the first individual directional coupler with respect to a second plane that is situated between the first and second individual directional couplers and is perpendicular to the first plane.

Each of the first and second individual directional couplers may further include a multilayer stack including a plurality of dielectric layers and a plurality of conductor layers stacked together. The main line and the subline are formed using the plurality of conductor layers. In this case, the plurality of conductor layers of the multilayer stack of the second individual directional coupler may have plane-symmetrical positional relationship with the plurality of conductor layers of the multilayer stack of the first individual directional coupler with respect to the second plane.

The bi-directional coupler of the present invention may further include a first resistor that connects the fourth terminal of the first individual directional coupler to a ground, and a second resistor that connects the fourth terminal of the second individual directional coupler to the ground.

In the bi-directional coupler of the present invention, the fourth terminal of the second individual directional coupler may be electrically connected to the fourth terminal of the first individual directional coupler. In such a case, the bi-directional coupler may further include a delay line that electrically connects the fourth terminal of the first individual directional coupler and the fourth terminal of the second individual directional coupler.

In the bi-directional coupler of the present invention, the circuit configuration in the first mode and the circuit configuration in the second mode are equivalent to each other. The bi-directional coupler of the present invention is bi-directional even if each of the first and second individual directional couplers is not bi-directional. The present invention thus easily achieves bi-directionality of the coupler.

Other and further objects, features and advantages of the invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe the circuit configuration of a bi-directional coupler according to a first embodiment of the invention.

Figure 1:
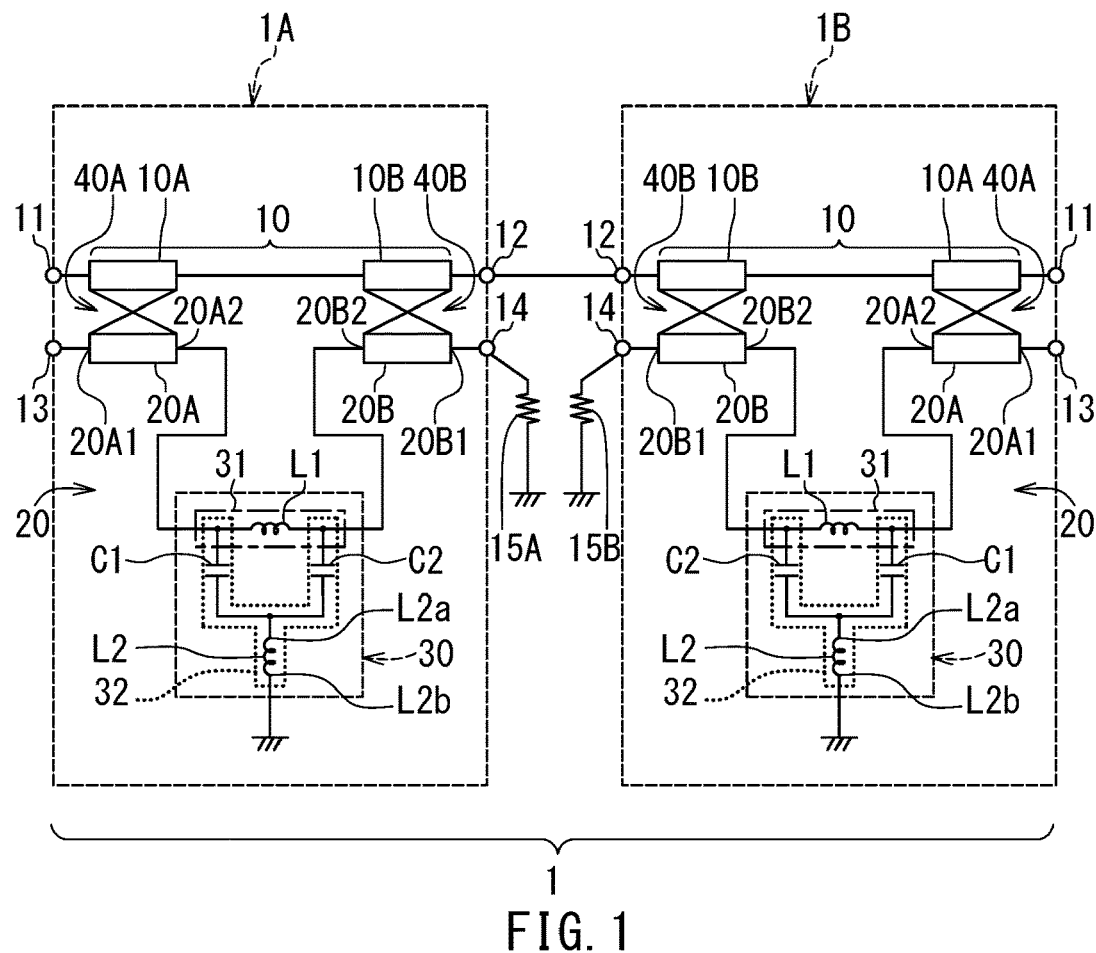
FIG. 1 is a circuit diagram illustrating the circuit configuration of a bi-directional coupler according to a first embodiment of the invention.

As shown in FIG. 1, the bi-directional coupler 1 according to the first embodiment includes a first individual directional coupler 1A and a second individual directional coupler 1B. The first and second individual directional couples 1A and 1B are individual electronic components having mutually equivalent circuit configurations. Each of the first and second individual directional couplers 1A and 1B includes a first terminal 11, a second terminal 12, a third terminal 13, a fourth terminal 14, a main line 10 connecting the first terminal 11 and the second terminal 12, and a subline 20 connecting the third terminal 13 and the fourth terminal 14.

The subline 20 includes at least one coupling line section configured to be electromagnetically coupled to the main line 10. In the present embodiment, specifically, the subline 20 includes a first coupling line section 20A and a second coupling line section 20B as the at least one coupling line section. The subline 20 further includes a matching section 30 provided between the first coupling line section 20A and the second coupling line section 20B in circuit configuration. The matching section 30 causes a change in the phase of a signal passing therethrough. The first coupling line section 20A and the second coupling line section 20B may have mutually different strengths of coupling to the main line 10.

Each of the first and second individual directional couplers 1A and 1B functions as a directional coupler by using the first terminal 11 as an input port, the second terminal 12 as an output port, the third terminal 13 as a coupling port, and the fourth terminal 14 as a termination port.

The second terminal 12 of the second individual directional coupler 1B is electrically connected to the second terminal 12 of the first individual directional coupler 1A.

The bi-directional coupler 1 further includes a first resistor 15A that connects the fourth terminal 14 of the first individual directional coupler 1A to the ground, and a second resistor 15B that connects the fourth terminal 14 of the second individual directional coupler 1B to the ground. The first and second resistors 15A and 15B each have a resistance of 50Ω, for example.

The circuit configuration of the first and second individual directional couplers 1A and 1B will now be described in detail. The following description holds true for both of the first and second individual directional couplers 1A and 1B.

The first coupling line section 20A has a first end 20A1 and a second end 20A2 opposite to each other. The second coupling line section 20B has a first end 20B1 and a second end 20B2 opposite to each other. The first end 20A1 of the first coupling line section 20A is connected to the third terminal 13. The first end 20B1 of the second coupling line section 20B is connected to the fourth terminal 14.

The matching section 30 includes a first path 31 connecting the second end 20A2 of the first coupling line section 20A and the second end 20B2 of the second coupling line section 20B, and a second path 32 connecting the first path 31 to the ground. The first path 31 includes a first inductor L1.

The second path 32 includes a first capacitor C1 and a second inductor L2 connected in series. The second inductor L2 has a first end L2a, which is closest to the first path 31 in circuit configuration, and a second end L2b, which is closest to the ground in circuit configuration. The first capacitor C1 is provided between one end of the first inductor L1 and the first end L2a of the second inductor L2. In the first embodiment, the second path 32 further includes a second capacitor C2 provided between the other end of the first inductor L1 and the first end L2a of the second inductor L2. The second inductor L2 has an inductance of 0.1 nH or higher. The inductance of the second inductor L2 is preferably not higher than 7 nH.

The main line 10 includes a first portion 10A configured to be electromagnetically coupled to the first coupling line section 20A, and a second portion 10B configured to be electromagnetically coupled to the second coupling line section 20B. Here, the first portion 10A and the first coupling line section 20A will be collectively referred to as a first coupling section 40A. The second portion 10B and the second coupling line section 20B will be collectively referred to as a second coupling section 40B.

The strengths of coupling of the first and second coupling sections 40A and 40B will be defined as follows. The strength of coupling of the first coupling section 40A is the strength of coupling of the first coupling line section 20A to the main line 10. The strength of coupling of the first coupling section 40A is expressible in terms of the coupling of the first coupling section 40A by itself. The higher the coupling of the first coupling section 40A by itself, the higher the strength of coupling of the first coupling section 40A.

The strength of coupling of the second coupling section 40B is the strength of coupling of the second coupling line section 20B to the main line 10. The strength of coupling of the second coupling section 40B is expressible in terms of the coupling of the second coupling section 40B by itself. The higher the coupling of the second coupling section 40B by itself, the higher the strength of coupling of the second coupling section 40B.

In the present embodiment, the second coupling line section 20B is coupled more strongly to the main line 10 than is the first coupling line section 20A. In other words, the strength of coupling of the second coupling section 40B by itself is higher than the strength of coupling of the first coupling section 40A by itself.

The matching section 30 is a circuit for performing impedance matching between a signal source and a load, assuming a situation in which the fourth terminal 14 is grounded via a termination resistor serving as the load, and the third terminal 13 is connected with a signal source having an output impedance equal to the resistance of the termination resistor (e.g., 50Ω). On the assumption of the above situation, the matching section 30 is designed so that the reflection coefficient as viewed in the direction from the third terminal 13 to the fourth terminal 14 has an absolute value of zero or near zero in the service frequency band of the bi-directional coupler 1.

The operation of each of the first and second individual directional couplers 1A and 1B by itself will now be described. Once a high frequency signal has been received at the first terminal 11, the high frequency signal is output from the second terminal 12. A coupling signal having power corresponding to the power of the high frequency signal received at the first terminal 11 is output from the third terminal 13.

A first signal path and a second signal path are formed between the first terminal 11 and the third terminal 13. The first signal path passes through the first coupling section 40A. The second signal path passes through the second coupling section 40B and the matching section 30. When a high frequency signal has been received at the first terminal 11, the coupling signal to be output from the third terminal 13 is a signal resulting from a combination of respective signals passed through the first and second signal paths. A phase difference occurs between the signal passed through the first signal path and the signal passed through the second signal path. The coupling of each of the individual directional couplers 1A and 1B depends on the coupling of each of the first and second coupling sections 40A and 40B by itself and the phase difference between the signal passed through the first signal path and the signal passed through the second signal path.

On the other hand, a third signal path and a fourth signal path are formed between the second terminal 12 and the third terminal 13. The third signal path passes through the first coupling section 40A. The fourth signal path passes through the second coupling section 40B and the matching section 30. The isolation of each of the individual directional couplers 1A and 1B depends on the coupling of each of the first and second coupling sections 40A and 40B by itself and the phase difference between the signal passed through the third signal path and the signal passed through the fourth signal path.

The first coupling section 40A, the second coupling section 40B, and the matching section 30 have the function of preventing a variation in the coupling of each of the individual directional couplers 1A and 1B in response to a variation in the frequency of the high frequency signal. This will be described in detail below.

The coupling of each of the first coupling section 40A and the second coupling section 40B by itself increases with increasing frequency of the high frequency signal. In this case, given that the phase difference between a signal passed through the first signal path and a signal passed through the second signal path is constant, the power of the coupling signal increases with increasing frequency of the high frequency signal.

On the other hand, given that the power of the signal passed through the first signal path and the power of the signal passed through the second signal path each have a constant value, the power of the coupling signal decreases as the phase difference between the signal passed through the first signal path and the signal passed through the second signal path increases in a range from 0° to 180°.

The amount of change in the phase of a signal when passing through the matching section 30 varies depending on the frequency of the signal. Accordingly, the phase difference between the signal passed through the first signal path and the signal passed through the second signal path varies depending on the frequency of the high frequency signal received at the first terminal 11. Thus, a variation in the power of the coupling signal, in other words, a variation in the coupling of each of the individual directional couplers 1A and 1B with increase in the frequency of the high frequency signal can be reduced by designing the matching section 30 so that the aforementioned phase difference increases in the range from 0° to 180° with increase in the frequency of the high frequency signal in the service frequency band of the bi-directional coupler 1. This enables widening of the service frequency band of each of the individual directional couplers 1A and 1B.

Next, the operation of the bi-directional coupler 1 will be described. The bi-directional coupler 1 functions as a directional coupler in both of a first mode and a second mode. The first mode is a mode in which the first terminal 11 of the first individual directional coupler 1A is used as the input port, the first terminal 11 of the second individual directional coupler 1B is used as the output port, and the third terminal 13 of the first individual directional coupler 1A is used as the coupling port. The second mode is a mode in which the first terminal 11 of the second individual directional coupler 1B is used as the input port, the first terminal 11 of the first individual directional coupler 1A is used as the output port, and the third terminal 13 of the second individual directional coupler 1B is used as the coupling port. In the first mode, the third terminal 13 of the second individual directional coupler 1B is grounded via a termination resistor having a resistance of, for example, 50Ω. In the second mode, the third terminal 13 of the first individual directional coupler 1A is grounded via a termination resistor having a resistance of, for example, 50Ω.

In the first mode, a high frequency signal is received at the first terminal 11 of the first individual directional coupler 1A. The high frequency signal passes through the main line 10 of the first individual directional coupler 1A and the main line 10 of the second individual directional coupler 1B, and is output from the first terminal 11 of the second individual directional coupler 1B. The third terminal 13 of the first individual directional coupler 1A outputs a coupling signal having power corresponding to the power of the high frequency signal received at the first terminal 11 of the first individual directional coupler 1A. The coupling signal is a signal resulting from a combination of the signal passed through the first signal path and the signal passed through the second signal path in the first individual directional coupler 1A.

In the second mode, a high frequency signal is received at the first terminal 11 of the second individual directional coupler 1B. The high frequency signal passes through the main line 10 of the second individual directional coupler 1B and the main line 10 of the first individual directional coupler 1A, and is output from the first terminal 11 of the first individual directional coupler 1A. The third terminal 13 of the second individual directional coupler 1B outputs a coupling signal having power corresponding to the power of the high frequency signal received at the first terminal 11 of the second individual directional coupler 1B. The coupling signal is a signal resulting from a combination of the signal passed through the first signal path and the signal passed through the second signal path in the second individual directional coupler 1B.

Figure 2:
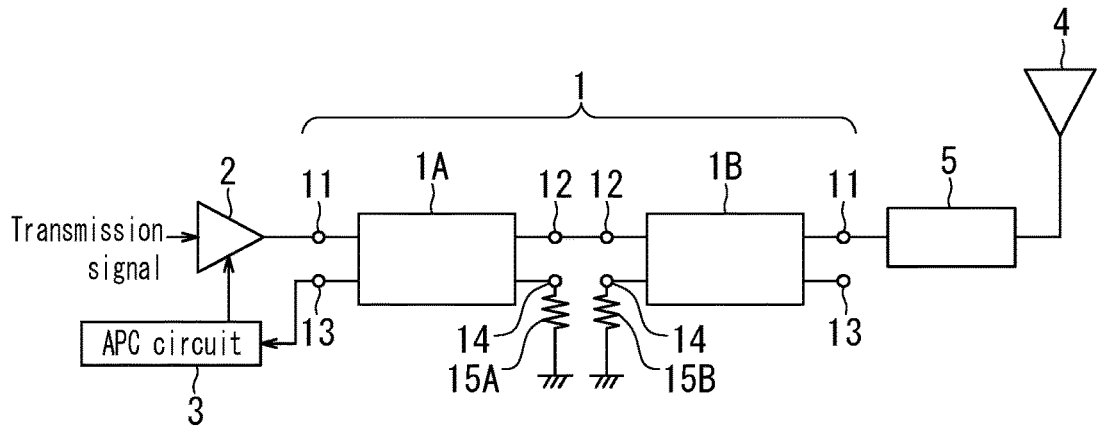
FIG. 2 is a circuit diagram illustrating an example of use of the bi-directional coupler according to the first embodiment of the invention.

Now, an example of use of the bi-directional coupler 1 in the first and second modes will be described with reference to FIG. 2. FIG. 2 is a circuit diagram illustrating an example of use of the bi-directional coupler 1. FIG. 2 illustrates a transmission circuit including the bi-directional coupler 1. The transmission circuit shown in FIG. 2 includes a power amplifier 2, an automatic power control (APC) circuit 3 and an impedance matching element 5, in addition to the bi-directional coupler 1.

The power amplifier 2 has an input, an output, and a gain control end. The input of the power amplifier 2 is configured to receive a transmission signal, which is a high frequency signal. The output of the power amplifier 2 is connected to the first terminal 11 of the individual directional coupler 1A.

The APC circuit 3 has an input and an output. The input of the APC circuit 3 is connected to the third terminal 13 of the individual directional coupler 1A. The output of the APC circuit 3 is connected to the gain control end of the power amplifier 2.

The second terminal 12 of the individual directional coupler 1B is connected to an antenna 4 via the impedance matching element 5. The impedance matching element 5 is an element for performing impedance matching between the transmission circuit and the antenna 4 in order to sufficiently reduce the level of a reflected-wave signal that occurs by reflection of the transmission signal off the antenna 4.

Next, the first mode of the bi-directional coupler 1 in the transmission circuit shown in FIG. 2 will be described. In the first mode, the transmission signal amplified by the power amplifier 2 is received at the first terminal 11 of the first individual directional coupler 1A, passes through the main line 10 of the first individual directional coupler 1A and the main line 10 of the second individual directional coupler 1B, and is output from the first terminal 11 of the second individual directional coupler 1B. The third terminal 13 of the first individual directional coupler 1A outputs a coupling signal having power that depends on the power of the transmission signal received at the first terminal 11 of the first individual directional coupler 1A. The transmission signal output from the first terminal 11 of the second individual directional coupler 1B passes through the impedance matching element 5 and is emitted from the antenna 4. The coupling signal is received at the APC circuit 3. The APC circuit 3 controls the gain of the power amplifier 2 in accordance with the level of the coupling signal so that the power amplifier 2 provides an output signal of approximately constant level.

Next, the second mode of the bi-directional coupler 1 in the transmission circuit shown in FIG. 2 will be described. The bi-directional coupler 1 in the second mode is used to detect the level of a reflected-wave signal that occurs by reflection of the transmission signal off the antenna 4. In the second mode, the reflected-wave signal is the high frequency signal to be received at the bi-directional coupler 1. The reflected-wave signal is received at the first terminal 11 of the second individual directional coupler 1B, passes through the main line 10 of the second individual directional coupler 1B and the main line 10 of the first individual directional coupler 1A, and is output from the first terminal 11 of the first individual directional coupler 1A. The third terminal 13 of the second individual directional coupler 1B outputs a coupling signal having power that depends on the power of the reflected-wave signal. A power detector (not illustrated) connected to the third terminal 13 of the second individual directional coupler 1B detects the level of the coupling signal. The information on the level of the coupling signal is used to adjust the characteristics of the impedance matching element 5 so as to sufficiently reduce the level of the reflected-wave signal.

Figure 3:
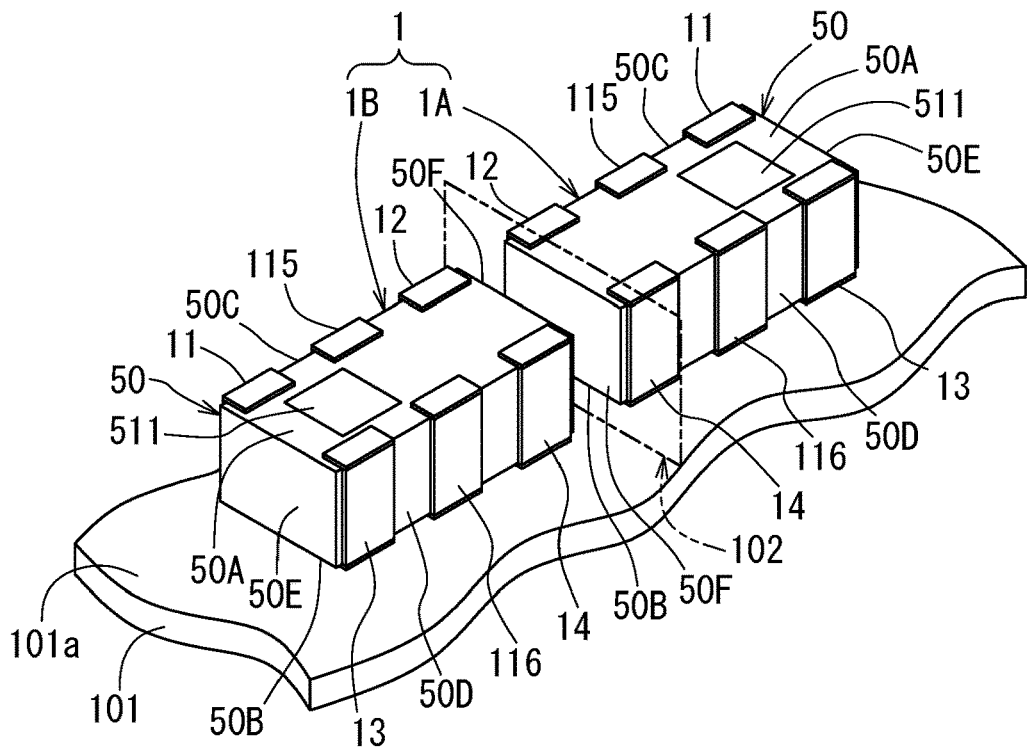
FIG. 3 is a perspective view of the bi-directional coupler according to the first embodiment of the invention.

Next, an example of the structure and arrangement of the first and second individual directional couplers 1A and 1B will be described. FIG. 3 is a perspective view of the bi-directional coupler 1. As shown in FIG. 3, the first and second individual directional couplers 1A and 1B are arranged in parallel on a top surface 101a of a mount body 101 such as a mounting board. The top surface 101a corresponds to the first plane in the present invention.

Each of the first and second individual directional couplers 1A and 1B includes a multilayer stack 50 for integrating the first to fourth terminals 11 to 14, the main line 10, and the subline 20. As will be described in detail later, the multilayer stack 50 includes a plurality of dielectric layers and a plurality of conductor layers stacked together. The main line 10 and the subline 20 are formed using the plurality of conductor layers.

The multilayer stack 50 is shaped like a rectangular solid and has a periphery. The periphery of the multilayer stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. The direction perpendicular to the top surface 50A and the bottom surface 50B of the multilayer stack 50 is the direction in which the plurality of dielectric layers and conductor layers are stacked.

Each of the first and second individual directional couplers 1A and 1B has the first to fourth terminals 11 to 14 and two ground terminals 115 and 116. The ground terminals 115 and 116 are connected to the ground.

The terminals 11, 12 and 115 are arranged to extend from the top surface 50A to the bottom surface 50B through the side surface 50C. The terminals 13, 14 and 116 are arranged to extend from the top surface 50A to the bottom surface 50B through the side surface 50D.

In the example of FIG. 3, the terminals 11, 12, 13, 14, 115, and 116 of the second individual directional coupler 1B have plane-symmetrical positional relationship with the terminals 11, 12, 13, 14, 115, and 116 of the first individual directional coupler 1A with respect to a second plane 102 that is situated between the first and second individual directional couplers 1A and 1B and is perpendicular to the top surface 101a of the mount body 101. The individual directional couplers 1A and 1B are disposed such that their respective second terminals 12 are close to each other. This facilitates establishment of electrical connection between the respective second terminals 12 of the individual directional couplers 1A and 1B. The respective second terminals 12 of the individual directional couplers 1A and 1B are connected through a conductor layer (not illustrated) formed on the top surface 101a of the mount body 101, for example.

Figure 4:
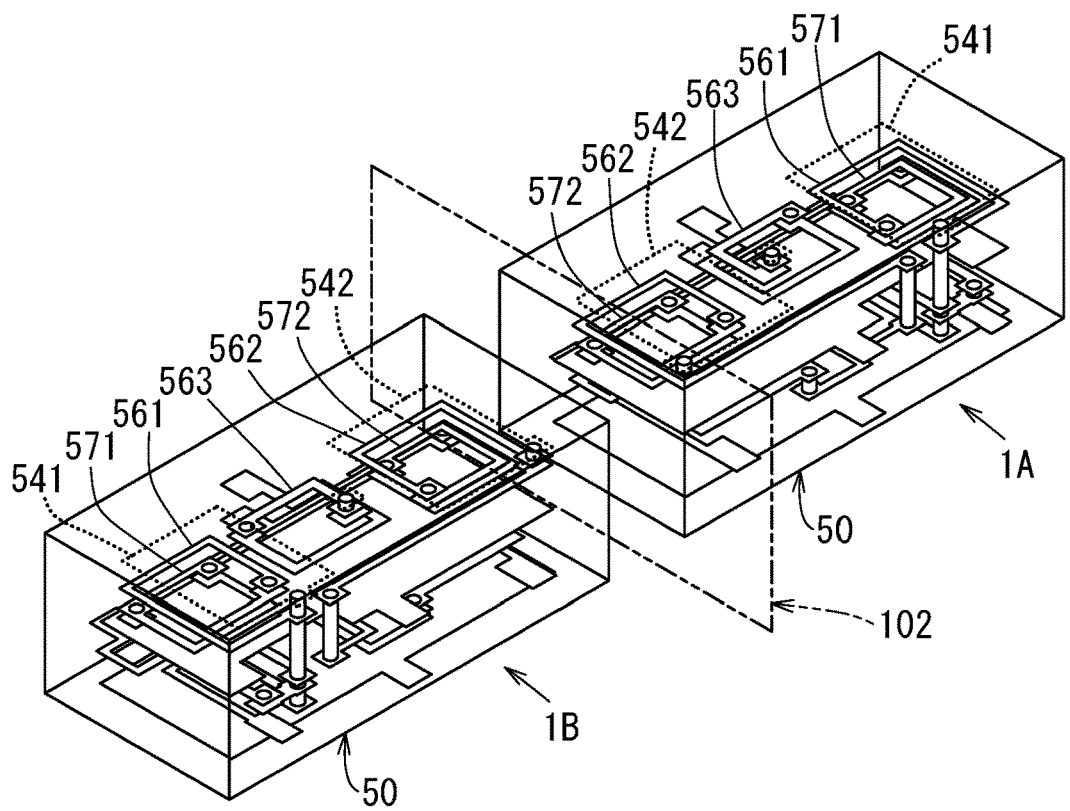
FIG. 4 is an internal perspective view of two multilayer stacks shown in FIG. 3.
Figure 5:
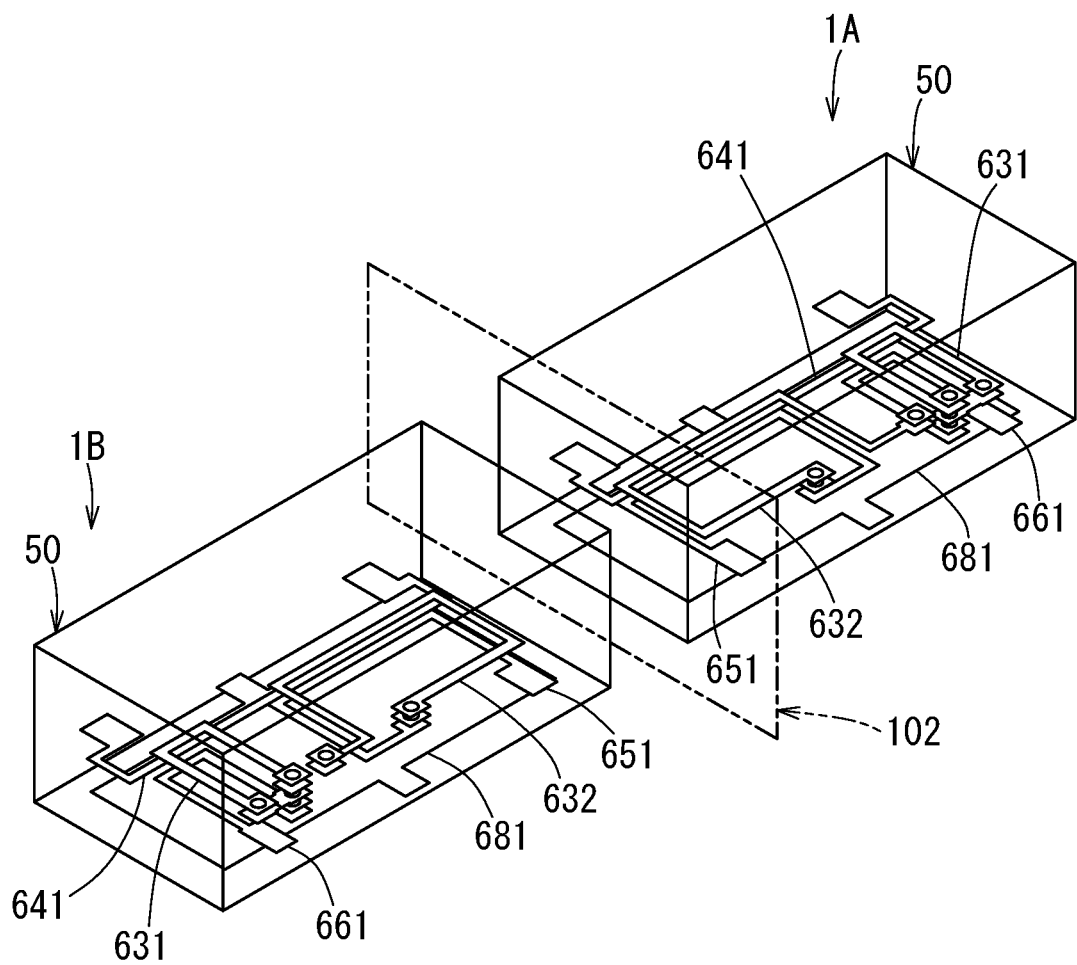
FIG. 5 is a partial internal perspective view of the two multilayer stacks shown in FIG. 3.

The multilayer stack 50 will now be described in detail with reference to FIG. 4 to FIG. 10C. FIG. 4 is an internal perspective view of the respective multilayer stacks 50 of the first and second individual directional couplers 1A and 1B shown in FIG. 3. FIG. 5 is a partial internal perspective view of the respective multilayer stacks 50 of the first and second individual directional couplers 1A and 1B shown in FIG. 3.

Each multilayer stack 50 includes nineteen dielectric layers stacked together. The nineteen dielectric layers will be referred to as the first to nineteenth dielectric layers in the order from top to bottom. FIG. 6A to FIG. 10C illustrate the respective top surfaces of the first to nineteenth dielectric layers of the multilayer stack 50 of the first individual directional coupler 1A. FIG. 6A to FIG. 6D illustrate the respective top surfaces of the first to fourth dielectric layers. FIG. 7A to FIG. 7D illustrate the respective top surfaces of the fifth to eighth dielectric layers. FIG. 8A to FIG. 8D illustrate the respective top surfaces of the ninth to twelfth dielectric layers. FIG. 9A to FIG. 9D illustrate the respective top surfaces of the thirteenth to sixteenth dielectric layers. FIG. 10A to FIG. 10C illustrate the respective top surfaces of the seventeenth to nineteenth dielectric layers.

Figure 6A:
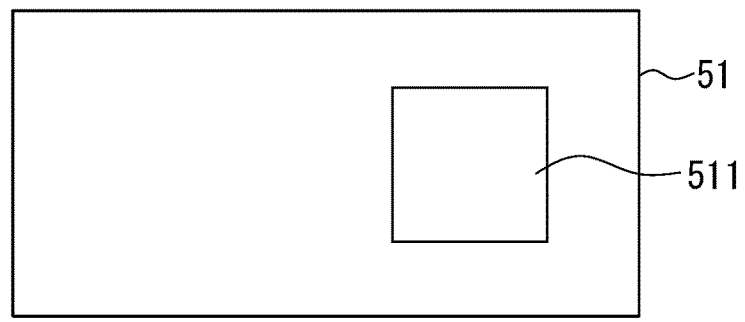
FIG. 6A to FIG. 6D are explanatory diagrams illustrating the respective top surfaces of first to fourth dielectric layers of the multilayer stack of a first individual directional coupler shown in FIG. 3.
Figure 6B:
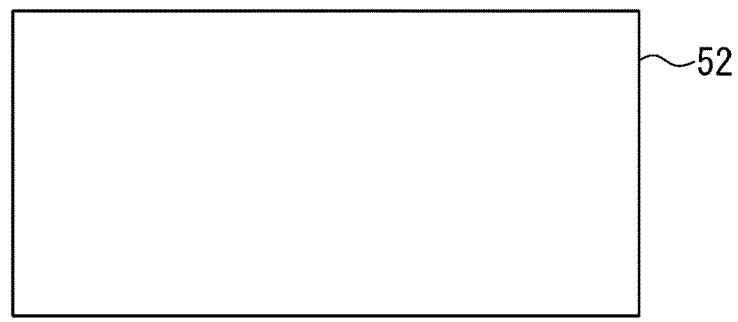

As shown in FIG. 6A, a conductor layer 511 for use as a mark is formed on the top surface of the first dielectric layer 51. As shown in FIG. 6B, no conductor layer is formed on the top surface of the second dielectric layer 52.

Figure 6C:
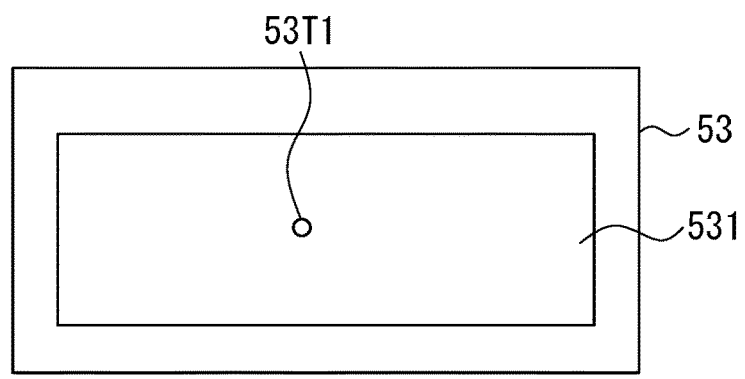

As shown in FIG. 6C, a conductor layer 531 is formed on the top surface of the third dielectric layer 53. The conductor layer 531 constitutes a portion of each of the capacitors C1 and C2. Further, a through hole 53T1 connected to the conductor layer 531 is formed in the dielectric layer 53.

Figure 6D:
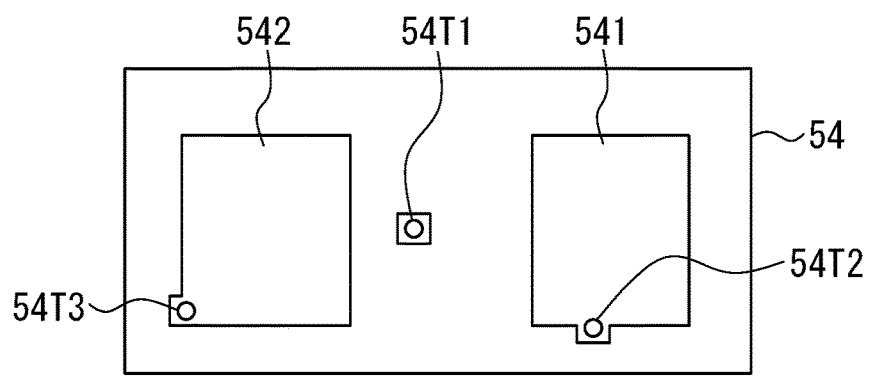

As shown in FIG. 6D, a conductor layer 541 and a conductor layer 542 are formed on the top surface of the fourth dielectric layer 54. The conductor layer 541 and the conductor layer 542 constitute other portions of the capacitor C1 and the capacitor C2, respectively. Further, in the dielectric layer 54 there are formed a through hole 54T1 connected to the through hole 53T1 shown in FIG. 6C, a through hole 54T2 connected to the conductor layer 541, and a through hole 54T3 connected to the conductor layer 542.

Figure 7A:
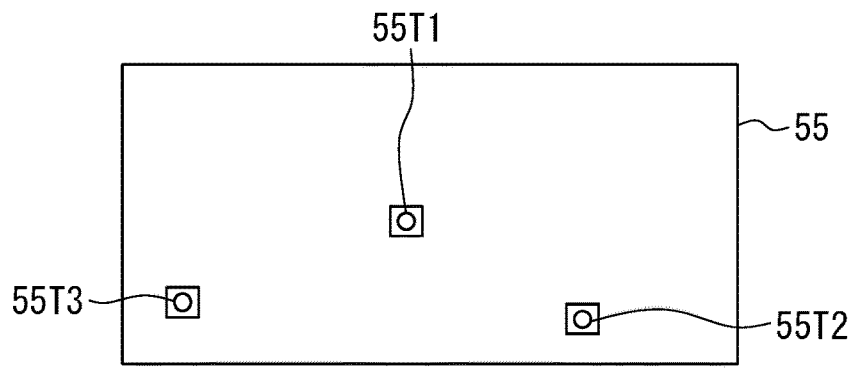
FIG. 7A to FIG. 7D are explanatory diagrams illustrating the respective top surfaces of fifth to eighth dielectric layers of the multilayer stack of the first individual directional coupler shown in FIG. 3.

As shown in FIG. 7A, through holes 55T1, 55T2 and 55T3 are formed in the fifth dielectric layer 55. The through holes 54T1, 54T2 and 54T3 shown in FIG. 6D are connected to the through holes 55T1, 55T2 and 55T3, respectively.

Figure 7B:
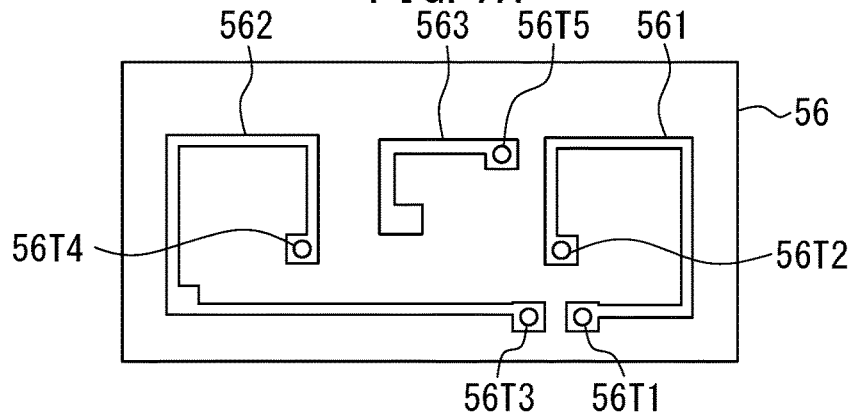

As shown in FIG. 7B, conductor layers 561, 562 and 563 are formed on the top surface of the sixth dielectric layer 56. The conductor layers 561 and 562 are used to form the inductor L1. The conductor layer 563 is used to form the inductor L2. Further, through holes 56T1, 56T2, 56T3, 56T4, and 56T5 are formed in the dielectric layer 56. The through hole 56T1 is connected to a portion of the conductor layer 561 near one end thereof. The through hole 56T2 is connected to a portion of the conductor layer 561 near the other end thereof. The through hole 56T3 is connected to a portion of the conductor layer 562 near one end thereof. The through hole 56T4 is connected to a portion of the conductor layer 562 near the other end thereof. The through hole 56T5 is connected to a portion of the conductor layer 563 near one end thereof. The through hole 55T1 shown in FIG. 7A is connected to a portion of the conductor layer 563 near the other end thereof. The through hole 55T2 shown in FIG. 7A is connected to the through hole 56T1. The through hole 55T3 shown in FIG. 7A is connected to a portion of the conductor layer 562 located between the one end and the other end thereof.

Figure 7C:
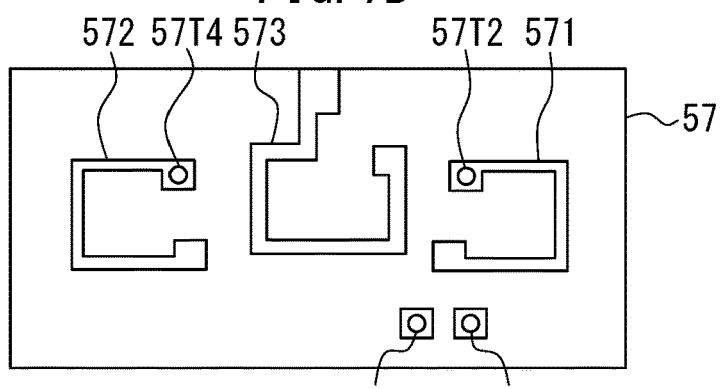

As shown in FIG. 7C, conductor layers 571, 572 and 573 are formed on the top surface of the seventh dielectric layer 57. The conductor layers 571 and 572 are used to form the inductor L1. The conductor layer 573 is used to form the inductor L2. Further, through holes 57T1, 57T2, 57T3 and 57T4 are formed in the dielectric layer 57. The through holes 56T1 and 56T3 shown in FIG. 7B are connected to the through holes 57T1 and 57T3, respectively. The through hole 57T2 is connected to a portion of the conductor layer 571 near one end thereof. The through hole 57T4 is connected to a portion of the conductor layer 572 near one end thereof. The through hole 56T2 shown in FIG. 7B is connected to a portion of the conductor layer 571 near the other end thereof. The through hole 56T4 shown in FIG. 7B is connected to a portion of the conductor layer 572 near the other end thereof. The through hole 56T5 shown in FIG. 7B is connected to a portion of the conductor layer 573 near one end thereof. The other end of the conductor layer 573 is connected to the ground terminal 115 shown in FIG. 3.

Figure 7D:
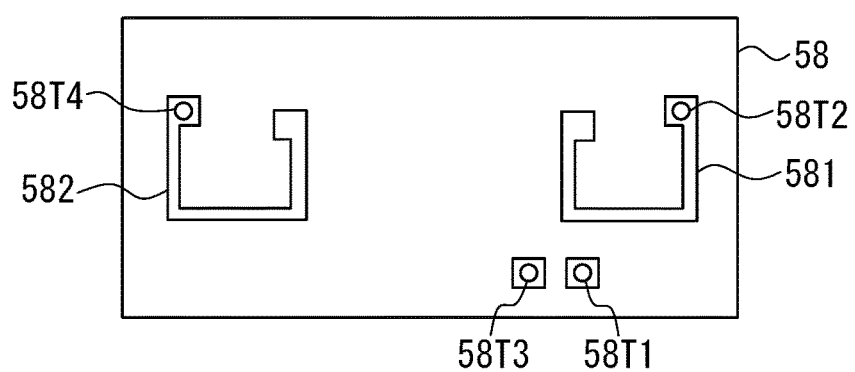

As shown in FIG. 7D, conductor layers 581 and 582 are formed on the top surface of the eighth dielectric layer 58. The conductor layers 581 and 582 are used to form the inductor L1 Further, through holes 58T1, 58T2, 58T3 and 58T4 are formed in the dielectric layer 58. The through holes 57T1 and 57T3 shown in FIG. 7C are connected to the through holes 58T1 and 58T3, respectively. The through hole 58T2 is connected to a portion of the conductor layer 581 near one end thereof. The through hole 58T4 is connected to a portion of the conductor layer 582 near one end thereof. The through hole 57T2 shown in FIG. 7C is connected to a portion of the conductor layer 581 near the other end thereof. The through hole 57T4 shown in FIG. 7C is connected to a portion of the conductor layer 582 near the other end thereof.

Figure 8A:
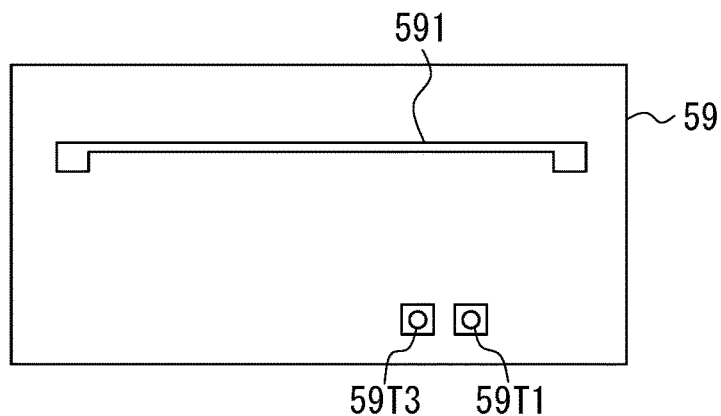
FIG. 8A to FIG. 8D are explanatory diagrams illustrating the respective top surfaces of ninth to twelfth dielectric layers of the multilayer stack of the first individual directional coupler shown in FIG. 3.

As shown in FIG. 8A, a conductor layer 591 is formed on the top surface of the ninth dielectric layer 59. The conductor layer 591 is used to form the inductor L1. Further, through holes 59T1 and 59T3 are formed in the dielectric layer 59. The through holes 58T1 and 58T3 shown in FIG. 7D are connected to the through holes 59T1 and 59T3, respectively. The through hole 58T2 shown in FIG. 7D is connected to a portion of the conductor layer 591 near one end thereof. The through hole 58T4 shown in FIG. 7D is connected to a portion of the conductor layer 591 near the other end thereof.

Figure 8B:
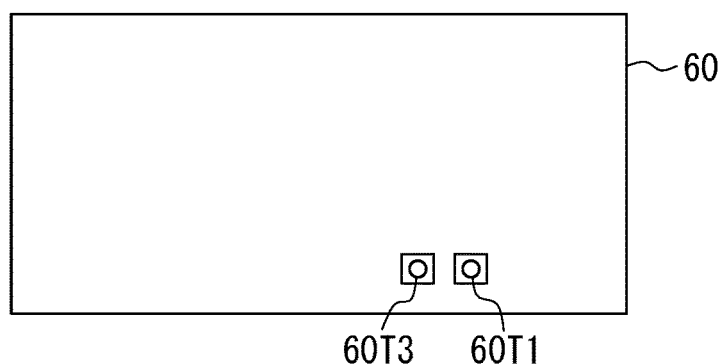

As shown in FIG. 8B, through holes 60T1 and 60T3 are formed in the tenth dielectric layer 60. The through holes 59T1 and 59T3 shown in FIG. 7A are connected to the through holes 60T1 and 60T3, respectively.

Figure 8C:
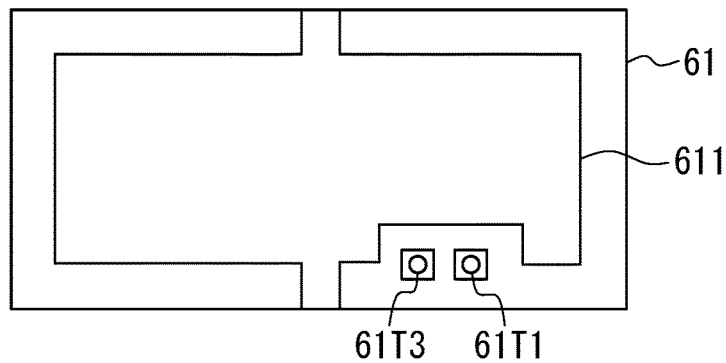

As shown in FIG. 8C, a ground conductor layer 611 is formed on the top surface of the eleventh dielectric layer 61. The ground conductor layer 611 is connected to the ground terminals 115 and 116 shown in FIG. 3. Further, through holes 61T1 and 61T3 are formed in the dielectric layer 61. The through holes 60T1 and 60T3 shown in FIG. 8B are connected to the through holes 61T1 and 61T3, respectively.

Figure 8D:
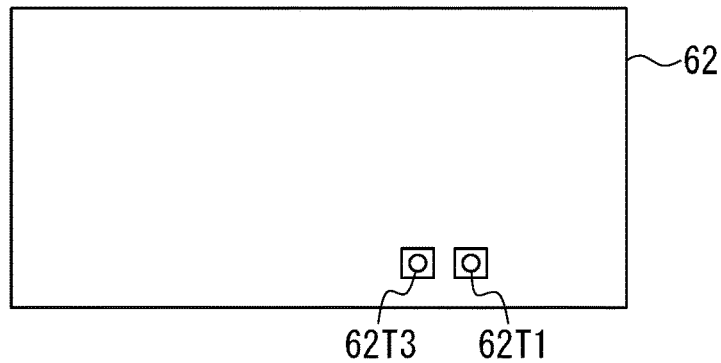

As shown in FIG. 8D, through holes 62T1 and 62T3 are formed in the twelfth dielectric layer 62. The through holes 61T1 and 61T3 shown in FIG. 8C are connected to the through holes 62T1 and 62T3, respectively.

Figure 9A:
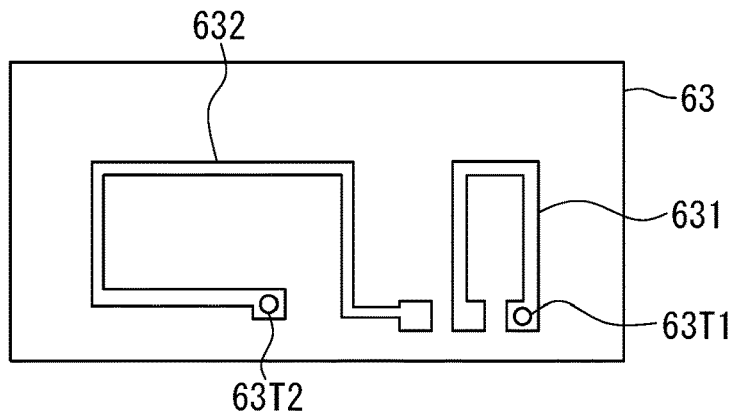
FIG. 9A to FIG. 9D are explanatory diagrams illustrating the respective top surfaces of thirteenth to sixteenth dielectric layers of the multilayer stack of the first individual directional coupler shown in FIG. 3.
Figure 10A:
FIG. 10A to FIG. 10C are explanatory diagrams illustrating the respective top surfaces of seventeenth to nineteenth dielectric layers of the multilayer stack of the first individual directional coupler shown in FIG. 3.
Figure 10B:
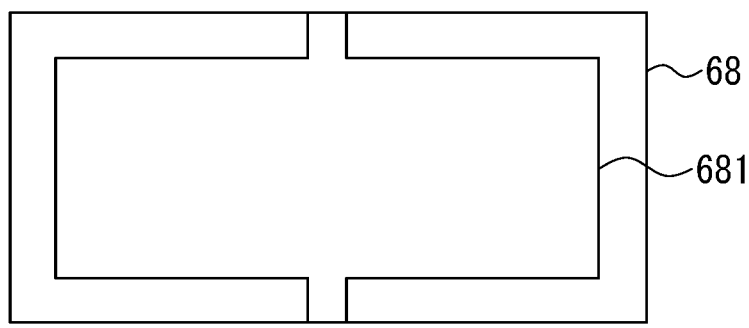
Figure 10C:

As shown in FIG. 9A, conductor layers 631 and 632 are formed on the top surface of the thirteenth dielectric layer 63. The conductor layer 631 is used to form the first coupling line section 20A. The conductor layer 632 is used to form the second coupling line section 20B. Further, through holes 63T1 and 63T2 are formed in the dielectric layer 63. The through hole 63T1 is connected to a portion of the conductor layer 631 near one end thereof. The through hole 63T2 is connected to a portion of the conductor layer 632 near one end thereof. The through hole 62T1 shown in FIG. 8D is connected to a portion of the conductor layer 631 near the other end thereof. The through hole 62T3 shown in FIG. 8D is connected to a portion of the conductor layer 632 near the other end thereof.

Figure 9B:
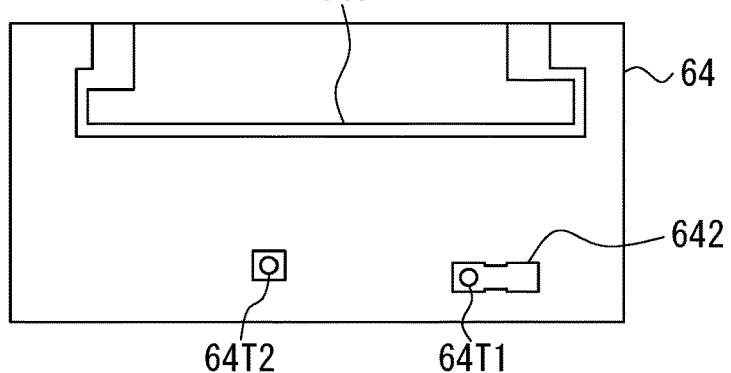

As shown in FIG. 9B, conductor layers 641 and 642 are formed on the top surface of the fourteenth dielectric layer 64. The conductor layer 641 is used to form the main line 10. One end of the conductor layer 641 is connected to the first terminal 11 shown in FIG. 3. The other end of the conductor layer 641 is connected to the second terminal 12 shown in FIG. 3. Further, through holes 64T1 and 64T2 are formed in the dielectric layer 64. The through hole 64T1 is connected to a portion of the conductor layer 642 near one end thereof. The through hole 63T1 shown in FIG. 9A is connected to a portion of the conductor layer 642 near the other end thereof. The through hole 63T2 shown in FIG. 9A is connected to the through hole 64T2.

Figure 9C:
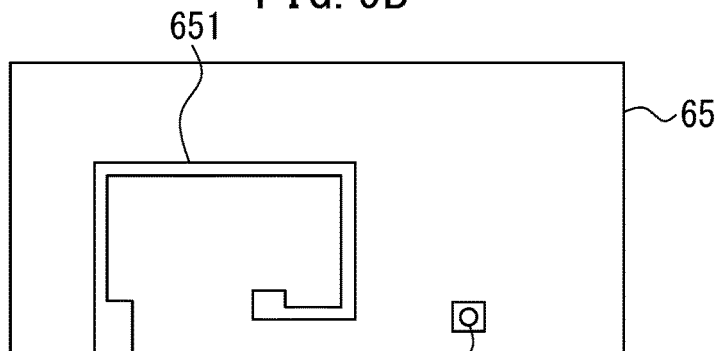

As shown in FIG. 9C, a conductor layer 651 is formed on the top surface of the fifteenth dielectric layer 65. The conductor layer 651 is used to form the second coupling line section 20B. One end of the conductor layer 651 is connected to the fourth terminal 14 shown in FIG. 3. Further, a through hole 65T1 is formed in the dielectric layer 65. The through hole 64T1 shown in FIG. 9B is connected to the through hole 65T1. The through hole 64T2 shown in FIG. 9B is connected to a portion of the conductor layer 651 near the other end thereof.

Figure 9D:
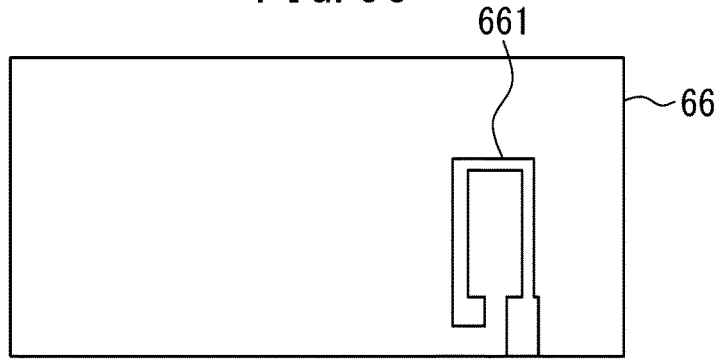

As shown in FIG. 9D, a conductor layer 661 is formed on the top surface of the sixteenth dielectric layer 66. The conductor layer 661 is used to form the first coupling line section 20A. One end of the conductor layer 661 is connected to the third terminal 13 shown in FIG. 3. The through hole 65T1 shown in FIG. 9C is connected to a portion of the conductor layer 661 near the other end thereof.

As shown in FIG. 10A, no conductor layer is formed on the top surface of the seventeenth dielectric layer 67. As shown in FIG. 10B, a ground conductor layer 681 is formed on the top surface of the eighteenth dielectric layer 68. The conductor layer 681 is connected to the ground terminals 115 and 116 shown in FIG. 3. As shown in FIG. 10C, no conductor layer is formed on the top surface of the nineteenth dielectric layer 69.

The multilayer stack 50 shown in FIG. 3 is formed by stacking the first to nineteenth dielectric layers 51 to 69. Then, the terminals 11, 12, 13, 14, 115 and 116 are formed on the periphery of the multilayer stack 50 to complete the individual directional coupler 1A shown in FIG. 3.

FIG. 4 omits the illustration of the conductor layers 511 and 531, and shows the conductor layers 541 and 542 in dotted lines. FIG. 5 omits the illustration of some of the conductor layers that are located on or above the conductor layers 631 and 632.

Correspondences of the circuit components of the individual directional coupler 1A shown in FIG. 1 with the components inside the multilayer stack 50 shown in FIG. 6A to FIG. 10C will now be described. The main line 10 is formed of the conductor layer 641 shown in FIG. 9B.

The first coupling line section 20A is formed as follows. The conductor layer 631 shown in FIG. 9A is connected to the conductor layer 661 shown in FIG. 9D via the through hole 63T1, the conductor layer 642 and the through holes 64T1 and 65T1. A portion of the conductor layer 631 is opposed to the top surface of a first portion of the conductor layer 641 with the dielectric layer 63 interposed therebetween. A portion of the conductor layer 661 is opposed to the bottom surface of the first portion of the conductor layer 641 with the dielectric layers 64 and 65 interposed therebetween. The aforementioned portion of the conductor layer 631 and the aforementioned portion of the conductor layer 661 constitute the first coupling line section 20A. The first portion of the conductor layer 641, to which the aforementioned portions of the conductor layers 631 and 661 are opposed, constitutes the first portion 10A of the main line 10.

The second coupling line section 20B is formed as follows. The conductor layer 632 shown in FIG. 9A is connected to the conductor layer 651 shown in FIG. 9C via the through holes 63T2 and 64T2. A portion of the conductor layer 632 is opposed to the top surface of a second portion of the conductor layer 641 with the dielectric layer 63 interposed therebetween. A portion of the conductor layer 651 is opposed to the bottom surface of the second portion of the conductor layer 641 with the dielectric layer 64 interposed therebetween. The aforementioned portion of the conductor layer 632 and the aforementioned portion of the conductor layer 651 constitute the second coupling line section 20B. The second portion of the conductor layer 641, to which the aforementioned portions of the conductor layers 632 and 651 are opposed, constitutes the second portion 10B of the main line 10.

The inductor L1 of the matching section 30 is formed as follows. The conductor layers 561, 571 and 581 shown in FIG. 7B to FIG. 7D are connected to each other in series via the through holes 56T2 and 57T2. The conductor layers 562, 572 and 582 shown in FIG. 7B to FIG. 7D are connected to each other in series via the through holes 56T4 and 57T4. The conductor layers 581 and 582 shown in FIG. 7D are connected to each other in series via the through holes 58T2 and 58T4 and the conductor layer 591 shown in FIG. 8A. The inductor L1 is constituted by these conductor layers 561, 571, 581, 591, 582, 572 and 562 and the through holes connecting them. The conductor layer 561 is connected via the through holes 56T1, 57T1, 58T1, 59T1, 60T1, 61T1 and 62T1 to the conductor layer 631 constituting part of the first coupling line section 20A. The conductor layer 562 is connected via the through holes 56T3, 57T3, 58T3, 59T3, 60T3, 61T3 and 62T3 to the conductor layer 632 constituting part of the second coupling line section 20B.

The capacitor C1 of the matching section 30 is constituted by the conductor layer 541 shown in FIG. 6D, the conductor layer 531 shown in FIG. 6C, and the dielectric layer 53 interposed therebetween. The conductor layer 541 is connected via the through holes 54T2, 55T2, 56T1, 57T1, 58T1, 59T1, 60T1, 61T1 and 62T1 to the conductor layer 631 constituting part of the first coupling line section 20A.

The capacitor C2 of the matching section 30 is constituted by the conductor layer 542 shown in FIG. 6D, the conductor layer 531 shown in FIG. 6C, and the dielectric layer 53 interposed therebetween. The conductor layer 542 is connected via the through holes 54T3 and 55T3, the conductor layer 562 and the through holes 56T3, 57T3, 58T3, 59T3, 60T3, 61T3 and 62T3 to the conductor layer 632 constituting part of the second coupling line section 20B.

The inductor L2 of the matching section 30 is constituted by the conductor layer 563 shown in FIG. 7B, the conductor layer 573 shown in FIG. 7C, and the through hole 56T5 connecting them. The conductor layer 563 is connected via the through holes 53T1, 54T1 and 55T1 to the conductor layer 531 shown in FIG. 6C.

In the multilayer stack 50, the ground conductor layer 611 connected to the ground is interposed between the conductor layer 641 constituting the main line 10 and the conductor layers constituting the matching section 30. Thus, the matching section 30 is not configured to be electromagnetically coupled to the main line 10.

As shown in FIG. 4 and FIG. 5, the plurality of conductor layers in the multilayer stack 50 of the second individual directional coupler 1B are structured to be plane-symmetrical to the plurality of conductor layers in the multilayer stack 50 of the first individual directional coupler 1A with respect to the second plane 102. In this case also, the circuit configurations of the first and second individual directional couplers 1A and 1B are equivalent to each other.

In the bi-directional coupler 1 according to the present embodiment, the circuit configuration in the first mode and the circuit configuration in the second mode are equivalent to each other. The coupler 1 is therefore bi-directional even if each of the first and second individual directional couplers 1A and 1B is not bi-directional. The results of a simulation verifying this will now be described.

The simulation examined the characteristics of the first and second individual directional couplers 1A and 1B and the bi-directional coupler 1. With regard to the characteristics of each of the first and second individual directional couplers 1A and 1B, a characteristic obtained with the first terminal 11 used as the input port, the second terminal 12 as the output port, the third terminal 13 as the coupling port, and the fourth terminal 14 as the termination port will be referred to as a forward characteristic, while a characteristic obtained with the second terminal 12 used as the input port, the first terminal 11 as the output port, the fourth terminal 14 as the coupling port, and the third terminal 13 as the termination port will be referred to as a backward characteristic.

Figure 11:
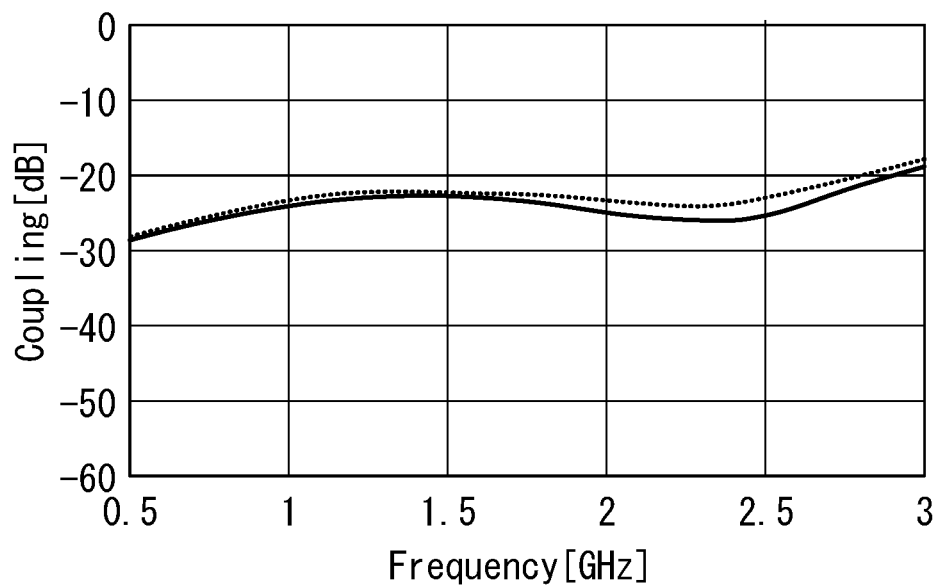
FIG. 11 is a characteristic diagram illustrating the frequency responses of couplings of the first individual directional coupler.

FIG. 11 is a characteristic diagram illustrating the frequency responses of forward coupling and backward coupling of the first individual directional coupler 1A. In FIG. 11, the horizontal axis represents frequency, and the vertical axis represents coupling. In FIG. 11, the solid curve represents the frequency response of the forward coupling as a forward characteristic, and the dotted curve represents the frequency response of the backward coupling as a backward characteristic.

Figure 12:
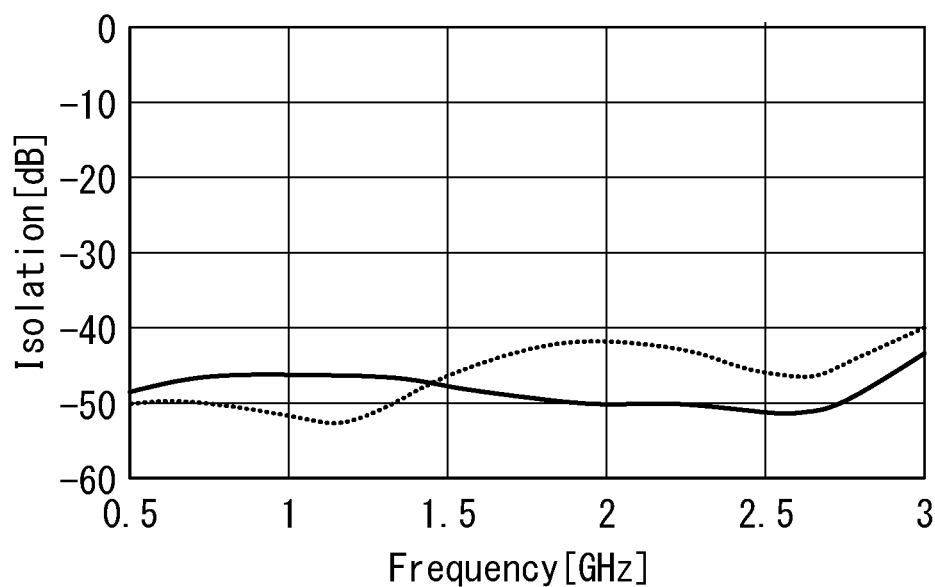
FIG. 12 is a characteristic diagram illustrating the frequency responses of isolations of the first individual directional coupler.

FIG. 12 is a characteristic diagram illustrating the frequency responses of forward isolation and backward isolation of the first individual directional coupler 1A. In FIG. 12, the horizontal axis represents frequency, and the vertical axis represents isolation. In FIG. 12, the solid curve represents the frequency response of the forward isolation as a forward characteristic, and the dotted curve represents the frequency response of the backward isolation as a backward characteristic.

For the first individual directional coupler 1A, as shown in FIGS. 11 and 12, the forward and backward characteristics are different from each other. Although not illustrated, the characteristics of the second individual directional coupler 1B are the same as those of the first individual directional coupler 1A. This indicates that each of the first and second individual directional couplers 1A and 1B is not bi-directional.

Figure 13:
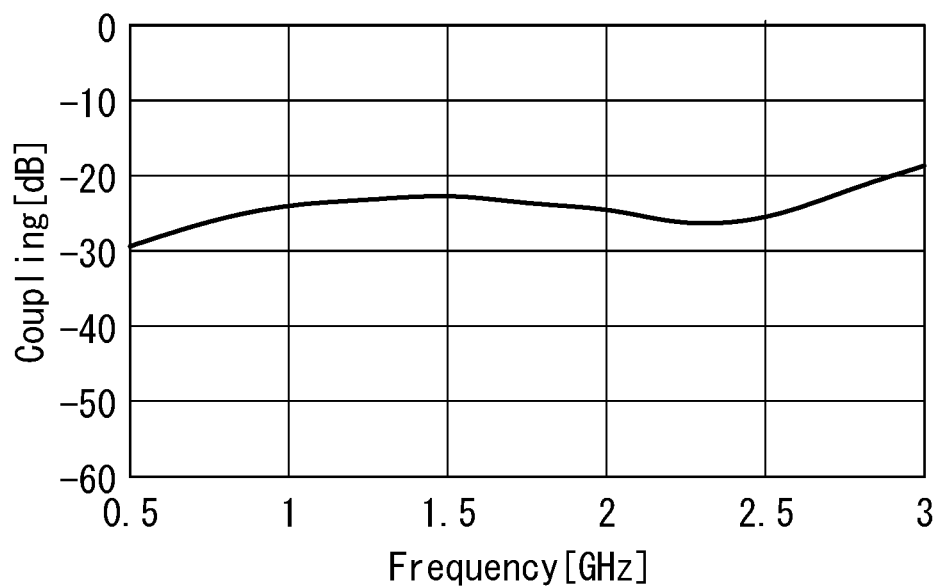
FIG. 13 is a characteristic diagram illustrating the frequency response of coupling of the bi-directional coupler according to the first embodiment of the invention.
Figure 14:
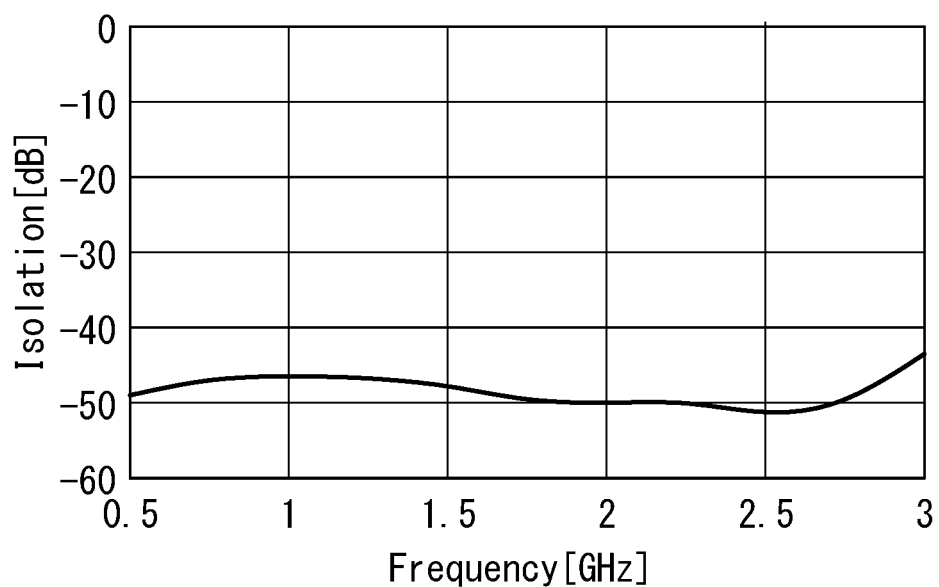
FIG. 14 is a characteristic diagram illustrating the frequency response of isolation of the bi-directional coupler according to the first embodiment of the invention.

FIG. 13 is a characteristic diagram illustrating the frequency response of coupling of the bi-directional coupler 1. In FIG. 13, the horizontal axis represents frequency, and the vertical axis represents coupling. FIG. 14 is a characteristic diagram illustrating the frequency response of isolation of the bi-directional coupler 1. In FIG. 14, the horizontal axis represents frequency, and the vertical axis represents isolation.

FIGS. 13 and 14 illustrate the characteristics of the bi-directional coupler 1 in the first mode. The characteristics of the bi-directional coupler 1 in the second mode are the same as those of the bi-directional coupler 1 in the first mode. The frequency response of the coupling shown in FIG. 13 is approximately the same as the frequency response of the forward coupling of the first individual directional coupler 1A shown in FIG. 11. The frequency response of the isolation shown in FIG. 14 is approximately the same as the frequency response of the forward isolation of the first individual directional coupler 1A shown in FIG. 12.

It is apparent from the above-described simulation results that the coupler 1 is bi-directional even if each of the first and second individual directional couplers 1A and 1B is not bi-directional.

Designing circuitry for each of the first and second individual directional couplers 1A and 1B requires no consideration of bi-directionality, and is therefore easier than designing circuitry for realizing a bi-directional coupler using a single electronic component. According to the present embodiment, the bi-directional coupler 1 is formed by connecting the first and second individual directional couplers 1A and 1B. The present embodiment thus makes it easy to realize a bi-directional coupler.

In the present embodiment, the subline 20 of each of the individual directional couplers 1A and 1B includes the first and second coupling line sections 20A and 20B and the matching section 30. This enables widening of the service frequency band of each of the individual directional couplers 1A and 1B, as mentioned previously. The present embodiment thus makes it easy to realize a wideband-capable bi-directional coupler.

Second Embodiment

Figure 15:
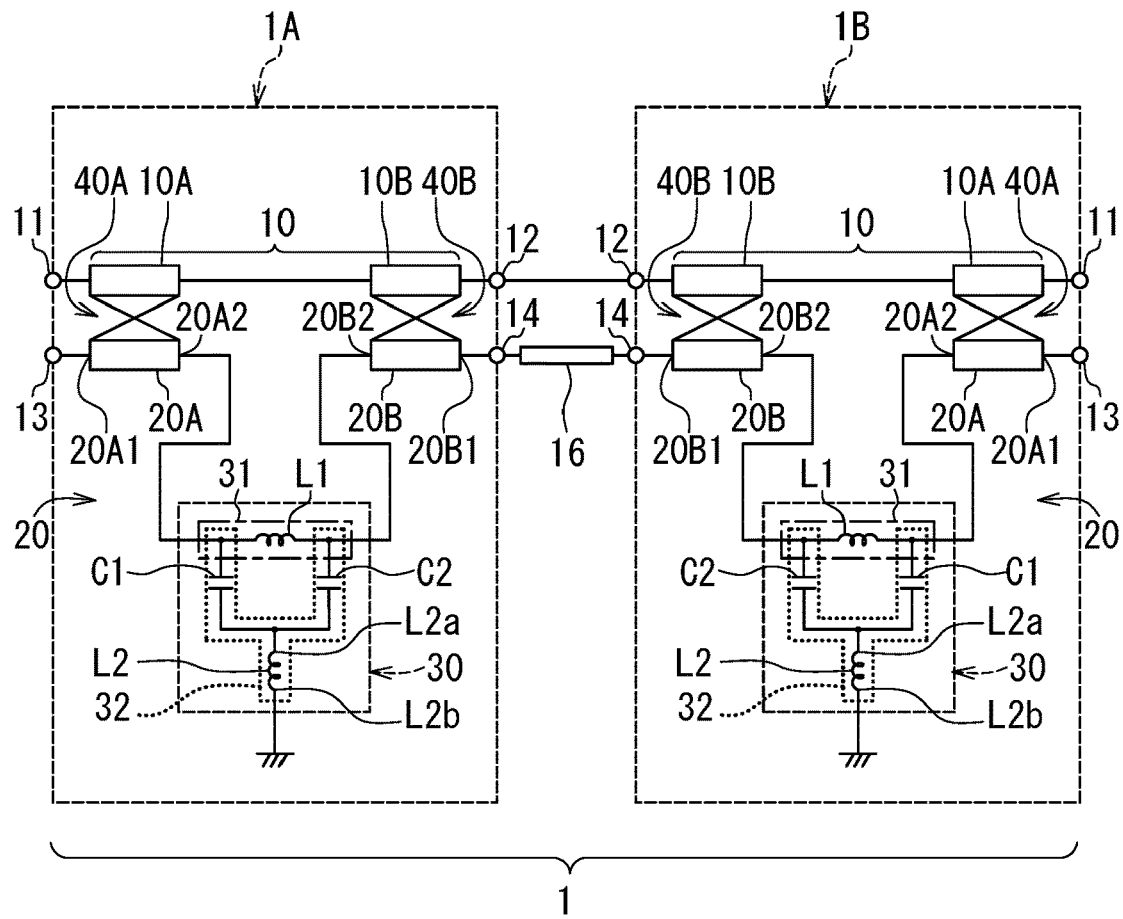
FIG. 15 is a circuit diagram illustrating the circuit configuration of a bi-directional coupler according to a second embodiment of the invention.

A bi-directional coupler 1 according to a second embodiment of the invention will now be described. FIG. 15 is a circuit diagram illustrating the circuit configuration of the bi-directional coupler 1 according to the second embodiment. The bi-directional coupler 1 according to the second embodiment includes neither of the first and second resistors 15A and 15B of the first embodiment, but includes a delay line 16 that electrically connects the fourth terminal 14 of the first individual directional coupler 1A and the fourth terminal 14 of the second individual directional coupler 1B. The delay line 16 causes a change in the phase of a signal passing therethrough. The magnitude of the change in the phase caused by the delay line 16 is more than 0° and 360° or less for a signal of a frequency within the service frequency band of the bi-directional coupler 1.

The bi-directional coupler 1 according to the present embodiment operates differently from the bi-directional coupler 1 according to the first embodiment as described below. To begin with, in the first mode, first to fourth signal paths are formed between the first terminal 11 of the individual directional coupler 1A, which is used as the input port, and the third terminal 13 of the individual directional coupler 1A, which is used as the coupling port.

The first signal path is a signal path through the coupling section 40A of the individual directional coupler 1A. The second signal path is a signal path through the coupling section 40B and the matching section 30 of the individual directional coupler 1A. The third signal path is a signal path through the coupling section 40B of the individual directional coupler 1B, the delay line 16, and the matching section 30 of the individual directional coupler 1A. The fourth signal path is a signal path through the coupling section 40A and the matching section 30 of the individual directional coupler 1B, the delay line 16, and the matching section 30 of the individual directional coupler 1A.

The coupling signal to be output from the third terminal 13 of the individual directional coupler 1A is a signal resulting from a combination of respective signals passed through the first to fourth signal paths. The coupling of the bi-directional coupler 1 in the first mode depends on the coupling of each of the coupling sections 40A and 40B itself in each of the first and second individual directional couplers 1A and 1B and the phase relationships between the signals passed through the first to fourth signal paths.

Further, in the first mode, fifth to eighth signal paths are formed between the first terminal 11 of the individual directional coupler 1B, which is used as the output port, and the third terminal 13 of the individual directional coupler 1A, which is used as the coupling port.

The fifth signal path is a signal path through the coupling section 40A of the individual directional coupler 1A. The sixth signal path is a signal path through the coupling section 40B and the matching section 30 of the individual directional coupler 1A. The seventh signal path is a signal path through the coupling section 40B of the individual directional coupler 1B, the delay line 16, and the matching section 30 of the individual directional coupler 1A. The eighth signal path is a signal path through the coupling section 40A and the matching section 30 of the individual directional coupler 1B, the delay line 16, and the matching section 30 of the individual directional coupler 1A.

The isolation of the bi-directional coupler 1 in the first mode depends on the coupling of each of the coupling sections 40A and 40B by itself in each of the first and second individual directional couplers 1A and 1B and the phase relationships between the signals passed through the fifth to eighth signal paths.

In the second mode, ninth to twelfth signal paths are formed between the first terminal 11 of the individual directional coupler 1B, which is used as the input port, and the third terminal 13 of the individual directional coupler 1B, which is used as the coupling port. Further, thirteenth to sixteenth signal paths are formed between the first terminal 11 of the individual directional coupler 1A, which is used as the output port, and the third terminal 13 of the individual directional coupler 1B, which is used as the coupling port. The details of the ninth to sixteenth signal paths are the same as those of the first to eighth signal paths, as described above, provided that the individual directional coupler 1A and the individual directional coupler 1B are exchanged in the above description.

In the bi-directional coupler 1 according to the present embodiment, like the bi-directional coupler 1 according to the first embodiment, the circuit configuration in the first mode and the circuit configuration in the second mode are equivalent to each other. The coupler 1 is therefore bi-directional even if each of the first and second individual directional couplers 1A and 1B is not bi-directional.

The bi-directional coupler 1 according to the present embodiment is able to provide higher coupling than that of the bi-directional coupler 1 according to the first embodiment.

Figure 16:
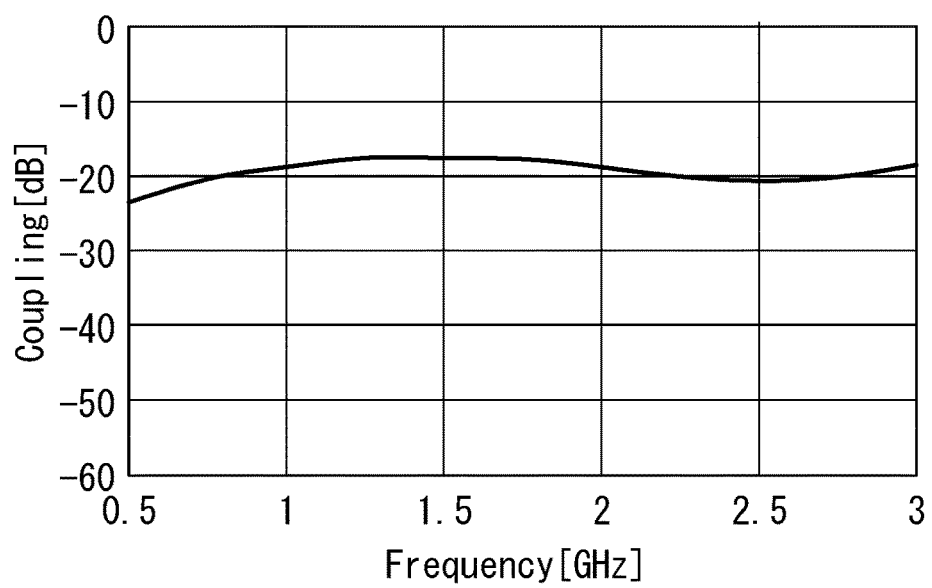
FIG. 16 is a characteristic diagram illustrating the frequency response of coupling of the bi-directional coupler according to the second embodiment of the invention.
Figure 17:
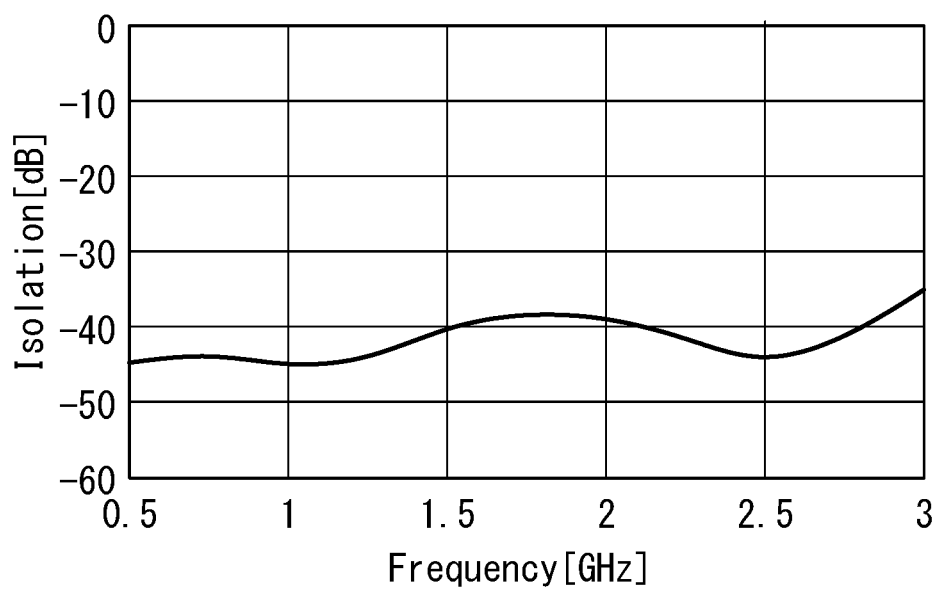
FIG. 17 is a characteristic diagram illustrating the frequency response of isolation of the bi-directional coupler according to the second embodiment of the invention.

FIGS. 16 and 17 show the characteristics of the bi-directional coupler 1 according to the present embodiment that were obtained by simulation. In the simulation, the magnitude of a phase change to be caused by the delay line 16 for a signal having a frequency of 2.5 GHz was set at 180°.

FIG. 16 is a characteristic diagram illustrating the frequency response of coupling of the bi-directional coupler 1. In FIG. 16, the horizontal axis represents frequency, and the vertical axis represents coupling. FIG. 17 is a characteristic diagram illustrating the frequency response of isolation of the bi-directional coupler 1. In FIG. 17, the horizontal axis represents frequency, and the vertical axis represents isolation. FIGS. 16 and 17 illustrate the characteristics of the bi-directional coupler 1 in the first mode. The characteristics of the bi-directional coupler 1 in the second mode are the same as those of the bi-directional coupler 1 in the first mode.

The configuration, operation and effects of the present embodiment are otherwise the same as those of the first embodiment.

Third Embodiment

Figure 18:
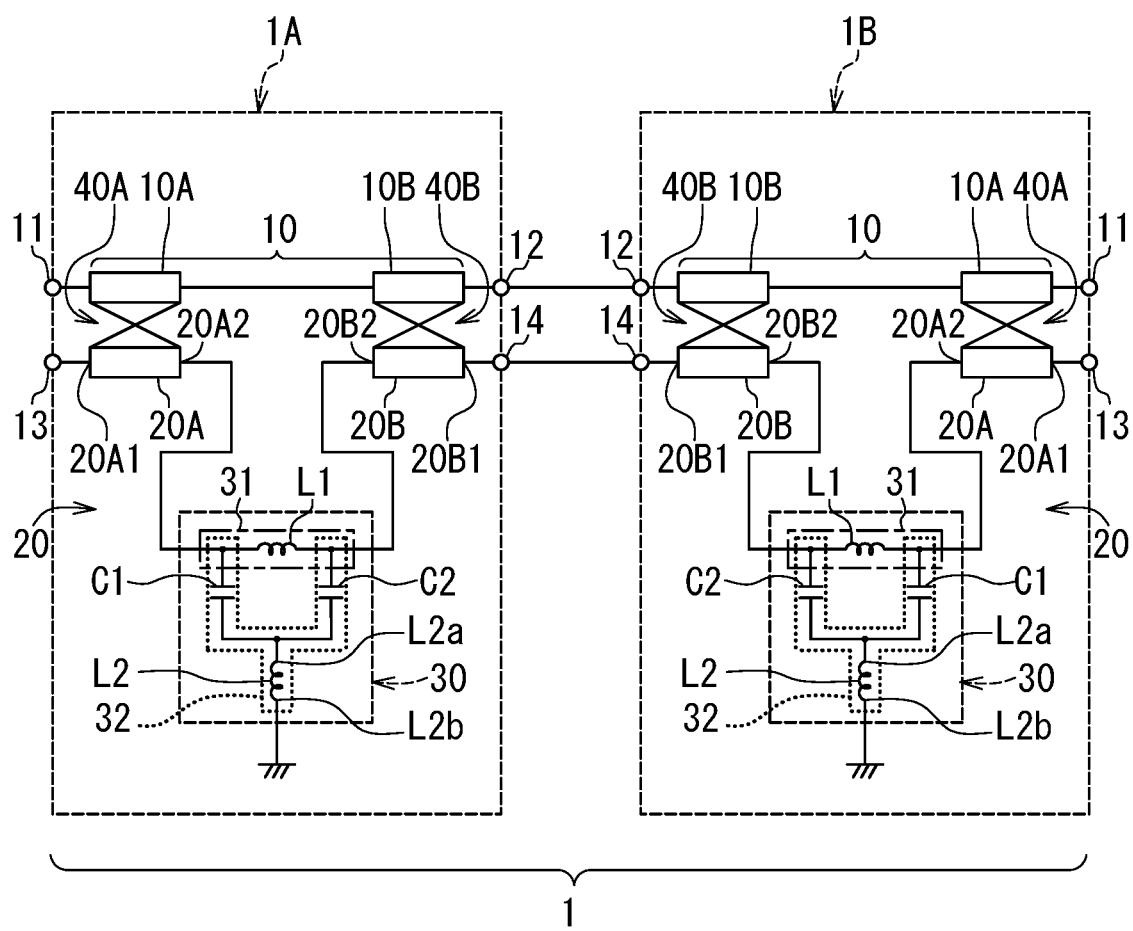
FIG. 18 is a circuit diagram illustrating the circuit configuration of a bi-directional coupler according to a third embodiment of the invention.

A bi-directional coupler 1 according to a third embodiment of the invention will now be described. FIG. 18 is a circuit diagram illustrating the circuit configuration of the bi-directional coupler 1 according to the third embodiment. The bi-directional coupler 1 according to the third embodiment includes none of the first and second resistors 15A and 15B of the first embodiment and the delay line 16 of the second embodiment. In the bi-directional coupler 1 according to the third embodiment, the fourth terminal 14 of the second individual directional coupler 1B is electrically connected to the fourth terminal 14 of the first individual directional coupler 1A without the delay line 16 therebetween.

In the present embodiment, the fourth terminal 14 of the second individual directional coupler 1B may be physically directly connected to the fourth terminal 14 of the first individual directional coupler 1A, or may be electrically connected thereto via a short line that hardly causes a change in phase.

The circuit configuration of the bi-directional coupler 1 according to the present embodiment is equivalent to that of the bi-directional coupler 1 according to the second embodiment where the delay line 16 is configured to cause a 0° or near 0° change in the phase of a signal of a frequency within the service frequency band of the bi-directional coupler 1.

In the bi-directional coupler 1 according to the present embodiment, like the bi-directional coupler 1 according to the second embodiment, the circuit configuration in the first mode and the circuit configuration in the second mode are equivalent to each other. The coupler 1 is therefore bi-directional even if each of the first and second individual directional couplers 1A and 1B is not bi-directional.

Figure 19:
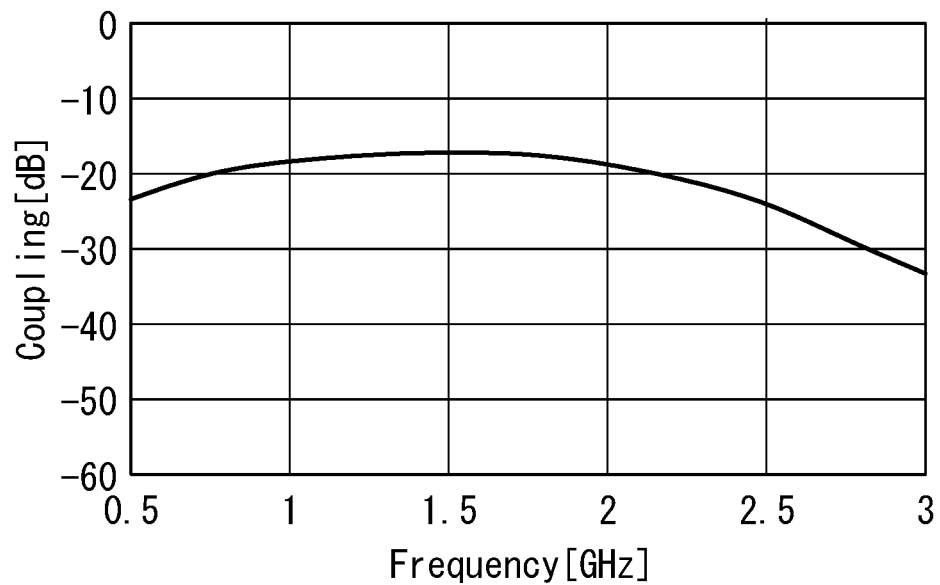
FIG. 19 is a characteristic diagram illustrating the frequency response of coupling of the bi-directional coupler according to the third embodiment of the invention.
Figure 20:
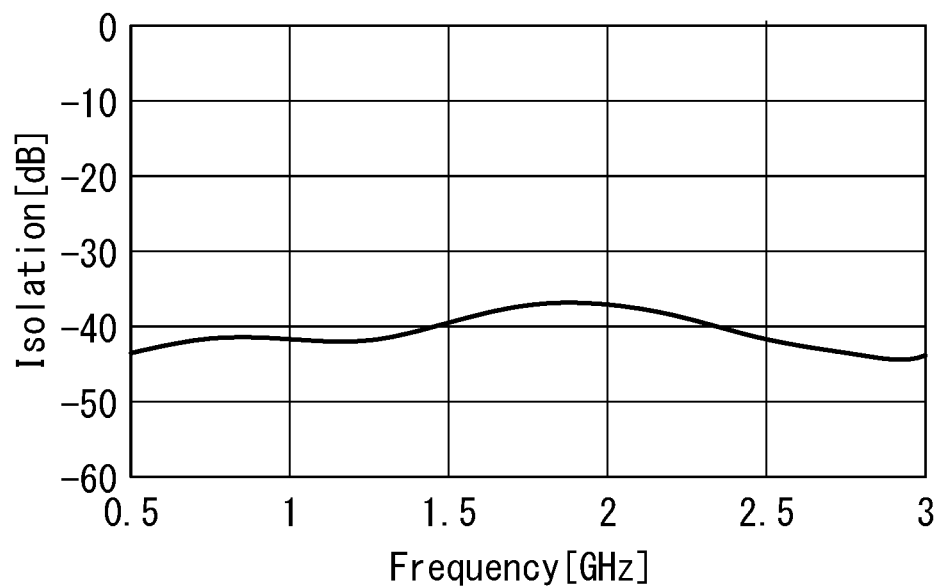
FIG. 20 is a characteristic diagram illustrating the frequency response of isolation of the bi-directional coupler according to the third embodiment of the invention.

FIGS. 19 and 20 show the characteristics of the bi-directional coupler 1 according to the present embodiment that were obtained by simulation. In the simulation, the magnitude of a phase change to occur between the fourth terminal 14 of the individual directional coupler 1A and the fourth terminal 14 of the individual directional coupler 1B was set at 0°.

FIG. 19 is a characteristic diagram illustrating the frequency response of coupling of the bi-directional coupler 1. In FIG. 19, the horizontal axis represents frequency, and the vertical axis represents coupling. FIG. 20 is a characteristic diagram illustrating the frequency response of isolation of the bi-directional coupler 1. In FIG. 20, the horizontal axis represents frequency, and the vertical axis represents isolation. FIGS. 19 and 20 illustrate the characteristics of the bi-directional coupler 1 in the first mode. The characteristics of the bi-directional coupler 1 in the second mode are the same as those of the bi-directional coupler 1 in the first mode.

The coupler 1 according to the present embodiment functions as a bi-directional coupler although it is slightly inferior to the bi-directional coupler 1 according to the second embodiment in terms of frequency response of coupling.

The configuration, operation and effects of the present embodiment are otherwise the same as those of the second embodiment.

The present invention is not limited to the foregoing embodiments, and various modifications may be made thereto. For example, the circuit configuration and the structure of each of the first and second individual directional couplers are not limited to those illustrated in the first embodiment. For example, the first and second individual directional couplers may be identical in terms of layout of the terminals and/or the internal structure of the multilayer stack. Even in such a case, it is possible to realize a bi-directional coupler by electrically connecting the respective second terminals of the first and second individual directional couplers.

In the present invention, the first and second individual directional couplers may be stacked together, instead of being arranged in the first plane. Even in such a case, it is possible to realize a bi-directional coupler by electrically connecting the respective second terminals of the first and second individual directional couplers.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A bi-directional coupler comprising a first individual directional coupler and a second individual directional coupler, the first and second individual directional couplers being individual electronic components having mutually equivalent circuit configurations, wherein
   each of the first and second individual directional couplers includes: a first terminal; a second terminal; a third terminal; a fourth terminal; a main line connecting the first terminal and the second terminal; and a subline connecting the third terminal and the fourth terminal, the subline including a first coupling line section and a second coupling line section, and a matching section that is provided between the first coupling line section and the second coupling line section in circuit configuration, the first and second coupling line sections and the matching section being configured to be electromagnetically coupled to the main line,
   the matching section causes a change in the phase of a signal passing therethrough, the first coupling line section and the second coupling line section have mutually different strengths of coupling to the main line, each of the first and second individual directional couplers functions as a directional coupler by using the first terminal as an input port, the second terminal as an output port, the third terminal as a coupling port, and the fourth terminal as a termination port, the second terminal of the second individual directional coupler is electrically connected to the second terminal of the first individual directional coupler, and the bi-directional coupler functions as a directional coupler in both of a first mode and a second mode, the first mode being a mode in which the first terminal of the first individual directional coupler is used as the input port, the first terminal of the second individual directional coupler is used as the output port, and the third terminal of the first individual directional coupler is used as the coupling port, the second mode being a mode in which the first terminal of the second individual directional coupler is used as the input port, the first terminal of the first individual directional coupler is used as the output port, and the third terminal of the second individual directional coupler is used as the coupling port.

2. The bi-directional coupler according to claim 1, wherein
the first and second individual directional couplers are arranged in a first plane, and
the first to fourth terminals of the second individual directional coupler have plane-symmetrical positional relationship with the first to fourth terminals of the first individual directional coupler with respect to a second plane that is situated between the first and second individual directional couplers and is perpendicular to the first plane.

3. The bi-directional coupler according to claim 2, wherein
each of the first and second individual directional couplers further includes a multilayer stack including a plurality of dielectric layers and a plurality of conductor layers stacked together,
the main line and the subline are formed using the plurality of conductor layers, and
the plurality of conductor layers of the multilayer stack of the second individual directional coupler have plane-symmetrical positional relationship with the plurality of conductor layers of the multilayer stack of the first individual directional coupler with respect to the second plane.

4. The bi-directional coupler according to claim 1, further comprising a first resistor that connects the fourth terminal of the first individual directional coupler to a ground, and a second resistor that connects the fourth terminal of the second individual directional coupler to the ground.

5. The bi-directional coupler according to claim 1, wherein the fourth terminal of the second individual directional coupler is electrically connected to the fourth terminal of the first individual directional coupler.

6. The bi-directional coupler according to claim 5, further comprising a delay line that electrically connects the fourth terminal of the first individual directional coupler and the fourth terminal of the second individual directional coupler.

7. A bi-directional coupler comprising a first individual directional coupler and a second individual directional coupler, the first and second individual directional couplers being individual electronic components having mutually equivalent circuit configurations, wherein each of the first and second individual directional couplers includes: a first terminal; a second terminal; a third terminal; a fourth terminal; a main line connecting the first terminal and the second terminal; and a subline connecting the third terminal and the fourth terminal, the subline including at least one coupling line section configured to be electromagnetically coupled to the main line, the first and second individual directional couplers are arranged in a first plane, the first to fourth terminals of the second individual directional coupler have plane-symmetrical positional relationship with the first to fourth terminals of the first individual directional coupler with respect to a second plane that is situated between the first and second individual directional couplers and is perpendicular to the first plane, each of the first and second individual directional couplers functions as a directional coupler by using the first terminal as an input port, the second terminal as an output port, the third terminal as a coupling port, and the fourth terminal as a termination port, the second terminal of the second individual directional coupler is electrically connected to the second terminal of the first individual directional coupler, and the bi-directional coupler functions as a directional coupler in both of a first mode and a second mode, the first mode being a mode in which the first terminal of the first individual directional coupler is used as the input port, the first terminal of the second individual directional coupler is used as the output port, and the third terminal of the first individual directional coupler is used as the coupling port, the second mode being a mode in which the first terminal of the second individual directional coupler is used as the input port, the first terminal of the first individual directional coupler is used as the output port, and the third terminal of the second individual directional coupler is used as the coupling port.

8. The bi-directional coupler according to claim 7, wherein
the subline includes a first coupling line section and a second coupling line section as the at least one coupling line section,
the subline further includes a matching section that is provided between the first coupling line section and the second coupling line section in circuit configuration, and
the matching section causes a change in the phase of a signal passing therethrough.

9. The bi-directional coupler according to claim 7, wherein
each of the first and second individual directional couplers further includes a multilayer stack including a plurality of dielectric layers and a plurality of conductor layers stacked together,
the main line and the subline are formed using the plurality of conductor layers, and
the plurality of conductor layers of the multilayer stack of the second individual directional coupler have plane-symmetrical positional relationship with the plurality of conductor layers of the multilayer stack of the first individual directional coupler with respect to the second plane.

10. The bi-directional coupler according to claim 7, further comprising a first resistor that connects the fourth terminal of the first individual directional coupler to a ground, and a second resistor that connects the fourth terminal of the second individual directional coupler to the ground.

11. The bi-directional coupler according to claim 7, wherein the fourth terminal of the second individual directional coupler is electrically connected to the fourth terminal of the first individual directional coupler.

12. The bi-directional coupler according to claim 11, further comprising a delay line that electrically connects the fourth terminal of the first individual directional coupler and the fourth terminal of the second individual directional coupler.

* * * * *